United States Patent
Tung et al.

(10) Patent No.: US 8,300,299 B2
(45) Date of Patent: Oct. 30, 2012

(54) MEMS DEVICES WITH MULTI-COMPONENT SACRIFICIAL LAYERS

(75) Inventors: Ming-Hau Tung, San Francisco, CA (US); Lior Kogut, Haifa (IL)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 12 days.

(21) Appl. No.: 13/098,292

(22) Filed: Apr. 29, 2011

(65) Prior Publication Data

US 2011/0205615 A1  Aug. 25, 2011

Related U.S. Application Data

(60) Continuation of application No. 12/719,751, filed on Mar. 8, 2010, now Pat. No. 7,952,789, which is a continuation of application No. 12/263,752, filed on Nov. 3, 2008, now abandoned, which is a division of application No. 11/367,098, filed on Mar. 2, 2006, now Pat. No. 7,450,295.

(51) Int. Cl.
*G02B 26/00* (2006.01)
*H01L 21/311* (2006.01)

(52) U.S. Cl. ...................... 359/290; 438/695

(58) Field of Classification Search .................. 359/247, 359/290; 438/694, 695
See application file for complete search history.

(56) References Cited

U.S. PATENT DOCUMENTS

| | | | |
|---|---|---|---|
| 6,040,937 A | 3/2000 | Miles | |
| 6,436,504 B2 | 8/2002 | Miyamoto et al. | |
| 6,674,562 B1 | 1/2004 | Miles | |
| 6,787,968 B2 | 9/2004 | Tai et al. | |
| 7,123,216 B1 | 10/2006 | Miles | |
| 7,291,921 B2 | 11/2007 | Lin | |
| 7,327,510 B2 | 2/2008 | Cummings et al. | |
| 7,446,926 B2 | 11/2008 | Sampsell | |
| 7,450,295 B2 | 11/2008 | Tung et al. | |
| 7,485,236 B2 | 2/2009 | Lin | |
| 7,553,684 B2 | 6/2009 | Chui et al. | |
| 7,952,789 B2 | 5/2011 | Tung et al. | |
| 2002/0015215 A1 | 2/2002 | Miles | |
| 2003/0173499 A1 | 9/2003 | Cole et al. | |
| 2005/0012975 A1 | 1/2005 | George et al. | |
| 2006/0077503 A1 | 4/2006 | Palmateer et al. | |
| 2006/0079048 A1 | 4/2006 | Sampsell et al. | |

(Continued)

FOREIGN PATENT DOCUMENTS

CH  680534  9/1992

(Continued)

OTHER PUBLICATIONS

Yao et al., BrF3 dry release technology for large freestanding parylene microstructures and electrostatic actuators, Sensors and Actuators A, 97-98:771-775, Apr. 2002.

(Continued)

*Primary Examiner* — William Choi
(74) *Attorney, Agent, or Firm* — Knobbe, Martens, Olson & Bear, LLP

(57) ABSTRACT

Methods of forming a protective coating on one or more surfaces of a microelectromechanical device are disclosed comprising the steps of forming a composite layer of a sacrificial material and a protective material, and selectively etching the sacrificial material to form a protective coating. The protective coatings of the invention preferably improve one or more aspects of the performance of the microelectromechanical devices in which they are incorporated. Also disclosed are microelectromechanical devices formed by methods of the invention, and visual display devices incorporating such devices.

23 Claims, 12 Drawing Sheets

U.S. PATENT DOCUMENTS

| | | |
|---|---|---|
| 2007/0004080 A1 | 1/2007 | Ouyang |
| 2007/0170540 A1 | 7/2007 | Chung et al. |
| 2008/0158635 A1 | 7/2008 | Hagood et al. |
| 2009/0059345 A1 | 3/2009 | Tung et al. |

FOREIGN PATENT DOCUMENTS

| | | |
|---|---|---|
| DE | 10 2005 029803 | 1/2007 |
| JP | 2004-53852 | 2/2004 |
| WO | WO 2005/124869 | 12/2005 |
| WO | WO 2006/091860 | 8/2006 |

OTHER PUBLICATIONS

Office Action dated Jun. 26, 2007 in U.S. Appl. No. 11/367,098.
Office Action dated May 12, 2009 in U.S. Appl. No. 12/263,752.
Office Action dated Dec. 10, 2009 in U.S. Appl. No. 12/263,752.
ISR and WO for PCT/US07/003591 filed Feb. 9, 2007.
IPRP for PCT/US07/003591 filed Feb. 9, 2007.
Hoivik et al. 2002. Atomic layer deposition of conformal dielectric and protective coatings for released micro-electromechanical devices, IEEE, pp. 455-458.
Hoivik et al. 2002. Atomic layer deposition (ALD) technology for reliable RF MEMS, IEEE, pp. 1229-1232.

|  | +$V_{bias}$ | -$V_{bias}$ |
|---|---|---|
| 0 | Stable | Stable |
| +ΔV | Relax | Actuate |
| −ΔV | Actuate | Relax |

Column Output Signals (top), Row Output Signals (left)

MEMS DEVICES WITH MULTI-COMPONENT SACRIFICIAL LAYERS

RELATED APPLICATIONS

This application is a continuation of U.S. application Ser. No. 12/719,751, filed Mar. 8, 2010, which is a continuation of U.S. application Ser. No. 12/263,752, filed Nov. 3, 2008, which is a divisional of U.S. application Ser. No. 11/367,098, filed Mar. 2, 2006, now issued as U.S. Pat. No. 7,450,295 on Nov. 11, 2008, the disclosure of each of which is incorporated herein by reference in its entirety.

BACKGROUND

1. Field of the Invention

The invention relates generally to microelectromechanical systems (MEMS), and more particularly to interferometric modulators and display devices comprising such interferometric modulators.

2. Description of Related Art

Microelectromechanical systems (MEMS) include micro mechanical elements, actuators, and electronics. Micromechanical elements may be created using deposition, etching, and or other micromachining processes that etch away parts of substrates and/or deposited material layers or that add layers to form electrical and electromechanical devices. One type of MEMS device is called an interferometric modulator. As used herein, the term interferometric modulator or interferometric light modulator refers to a device that selectively absorbs and/or reflects light using the principles of optical interference. In certain embodiments, an interferometric modulator may comprise a pair of conductive plates, one or both of which may be transparent and/or reflective in whole or part and capable of relative motion upon application of an appropriate electrical signal. In a particular embodiment, one plate may comprise a stationary layer deposited on a substrate and the other plate may comprise a metallic membrane separated from the stationary layer by an air gap. As described herein in more detail, the position of one plate in relation to another can change the optical interference of light incident on the interferometric modulator. Such devices have a wide range of applications, and it would be beneficial in the art to utilize and/or modify the characteristics of these types of devices so that their features can be exploited in improving existing products and creating new products that have not yet been developed.

SUMMARY

The systems, methods, and devices described herein each have several aspects, no single one of which is solely responsible for its desirable attributes. Without limiting the scope of these systems, methods, and devices, their more prominent features will now be discussed briefly. After considering this discussion, and particularly after reading the section entitled "Detailed Description of Certain Embodiments" one will understand how the features of the invention provide advantages over other display devices.

Described herein is a method of manufacturing a microelectromechanical device with a protective coating, the method comprising the steps of forming a mixture of a sacrificial material and a protective material; depositing the mixture on a microelectromechanical device; selectively removing the sacrificial material; and forming a coating comprising the protective material on one or more surfaces of the microelectromechanical device.

In some embodiments, the sacrificial material is selectively removed by etching, the protective material being substantially more resistant to the etching than the sacrificial material.

In some embodiments, the microelectromechanical device is an interferometric modulator, the interferometric modulator comprising a substrate, a mirror positioned over the substrate that is at least partially reflective to incident light, and an optical layer positioned between the mirror and the substrate, the optical layer being at least partially transmissive to incident light; and the mixture is deposited between the mirror and the optical layer.

Also described herein is an apparatus comprising a plurality of interferometric modulators manufactured according to methods described herein. In various embodiments, the apparatus may comprise a display, a processor, a memory device, a driver circuit, a controller, an image source module, such as a receiver, a transceiver, or a transmitter, and/or an input device.

Also described herein is a method of manufacturing a microelectromechanical device with a protective coating, the method comprising the steps of forming a composite layer on one or more surfaces of a microelectromechanical device, the composite layer comprising a mixture of a protective material and a sacrificial material; and selectively removing the sacrificial material relative to the protective material from the composite layer.

In some embodiments, the selective removal of the sacrificial material from the composite layer forms a coating comprising the protective material on at least one or more surfaces of the microelectromechanical device.

Also described herein is a microelectromechanical device comprising an interferometric modulator comprising a substrate; a mirror positioned over the substrate that is at least partially reflective to incident light; an optical layer positioned over the substrate that is at least partially transmissive to incident light, said optical layer being spaced from the mirror; and a composite layer, said composite layer comprising a mixture of a protective material and a sacrificial material.

In another aspect, the invention is a method of forming a protective coating on a microelectromechanical device comprising depositing a composite layer on one or more surfaces of a microelectromechanical device, the composite layer comprising a mixture of a protective material and a sacrificial material; and etching the composite layer.

In various embodiments, the protective coatings of the invention may passivate one or more surfaces of the microelectromechanical device, render one or more surfaces of the microelectromechanical device resistant to moisture, corrosion, erosion, and/or wear, roughen the surfaces of and/or minimize contact area between two or more components of the microelectromechanical device, reduce stiction between two or more components of the microelectromechanical device, dissipate an electrical charge between two or more components of the microelectromechanical device, electrically and/or thermally insulate two or more components of the microelectromechanical device, modulate physical properties of one or more components of the microelectromechanical device, and/or perform another function that modulates one or more properties of the microelectromechanical device.

Additional aspects include microelectromechanical devices manufactured by methods described herein, and display systems incorporating such microelectromechanical devices.

DETAILED DESCRIPTION OF PREFERRED EMBODIMENTS

The following detailed description is directed to certain specific embodiments of the invention. However, the invention can be embodied in a multitude of different ways. In this description, reference is made to the drawings wherein like parts are designated with like numerals throughout. As will be apparent from the following description, the embodiments may be implemented in any device that is configured to display an image, whether in motion (e.g., video) or stationary (e.g., still image), and whether textual or pictorial. More particularly, it is contemplated that the embodiments may be implemented in or associated with a variety of electronic devices such as, but not limited to, mobile telephones, wireless devices, personal data assistants (PDAs), hand-held or portable computers, GPS receivers/navigators, cameras, MP3 players, camcorders, game consoles, wrist watches, clocks, calculators, television monitors, flat panel displays, computer monitors, auto displays (e.g., odometer display, etc.), cockpit controls and/or displays, display of camera views (e.g., display of a rear view camera in a vehicle), electronic photographs, electronic billboards or signs, projectors, architectural structures, packaging, and aesthetic structures (e.g., display of images on a piece of jewelry). MEMS devices of similar structure to those described herein can also be used in non-display applications such as in electronic switching devices.

Figure 1:
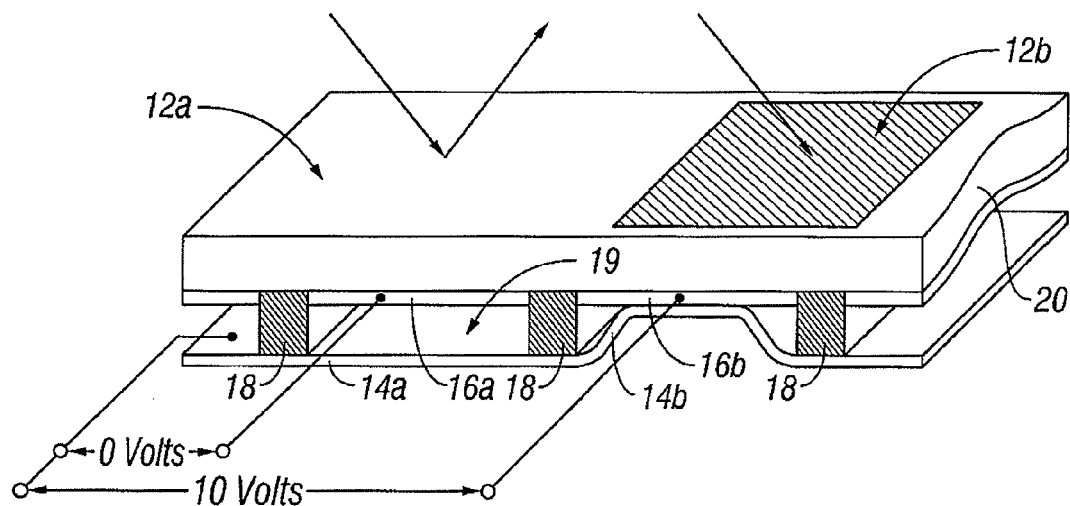
FIG. 1 is an isometric view depicting a portion of one embodiment of an interferometric modulator display in which a movable reflective layer of a first interferometric modulator is in a relaxed position and a movable reflective layer of a second interferometric modulator is in an actuated position.

One interferometric modulator display embodiment comprising an interferometric MEMS display element is illustrated in FIG. 1. In these devices, the pixels are in either a bright or dark state. In the bright ("on" or "open") state, the display element reflects a large portion of incident visible light to a user. When in the dark ("off" or "closed") state, the display element reflects little incident visible light to the user. Depending on the embodiment, the light reflectance properties of the "on" and "off" states may be reversed. MEMS pixels can be configured to reflect predominantly at selected colors, allowing for a color display in addition to black and white.

FIG. 1 is an isometric view depicting two adjacent pixels in a series of pixels of a visual display, wherein each pixel comprises a MEMS interferometric modulator. In some embodiments, an interferometric modulator display comprises a row/column array of these interferometric modulators. Each interferometric modulator includes a pair of reflective layers positioned at a variable and controllable distance from each other to form a resonant optical cavity with at least one variable dimension. In one embodiment, one of the reflective layers may be moved between two positions. In the first position, referred to herein as the relaxed position, the movable reflective layer is positioned at a relatively large distance from a fixed partially reflective layer. In the second position, referred to herein as the actuated position, the movable reflective layer is positioned more closely adjacent to the partially reflective layer. Incident light that reflects from the two layers interferes constructively or destructively depending on the position of the movable reflective layer, producing either an overall reflective or non-reflective state for each pixel.

The depicted portion of the pixel array in FIG. 1 includes two adjacent interferometric modulators 12a and 12b. In the interferometric modulator 12a on the left, a movable reflective layer 14a is illustrated in a relaxed position at a predetermined distance from an optical stack 16a, which includes a partially reflective layer. In the interferometric modulator 12b on the right, the movable reflective layer 14b is illustrated in an actuated position adjacent to the optical stack 16b.

The optical stacks 16a and 16b (collectively referred to as optical stack 16), as referenced herein, typically comprise of several fused layers, which can include an electrode layer, such as indium tin oxide (ITO), a partially reflective layer, such as chromium, and a transparent dielectric. The optical stack 16 is thus electrically conductive, partially transparent and partially reflective, and may be fabricated, for example, by depositing one or more of the above layers onto a transparent substrate 20. The partially reflective layer can be formed from a variety of materials that are partially reflective such as various metals, semiconductors, and dielectrics. The partially reflective layer can be formed of one or more layers of materials, and each of the layers can be formed of a single material or a combination of materials.

In some embodiments, the layers of the optical stack are patterned into parallel strips, and may form row electrodes in a display device as described further below. The movable reflective layers 14a, 14b may be formed as a series of parallel strips of a deposited metal layer or layers (orthogonal to the row electrodes of 16a, 16b) deposited on top of posts 18 and an intervening sacrificial material deposited between the posts 18. When the sacrificial material is etched away, the movable reflective layers 14a, 14b are separated from the optical stacks 16a, 16b by a defined gap 19. A highly conductive and reflective material such as aluminum may be used for the reflective layers 14, and these strips may form column electrodes in a display device.

With no applied voltage, the cavity 19 remains between the movable reflective layer 14a and optical stack 16a, with the movable reflective layer 14a in a mechanically relaxed state, as illustrated by the pixel 12a in FIG. 1. However, when a potential difference is applied to a selected row and column, the capacitor formed at the intersection of the row and column electrodes at the corresponding pixel becomes charged, and electrostatic forces pull the electrodes together. If the voltage is high enough, the movable reflective layer 14 is deformed and is forced against the optical stack 16. A dielectric layer (not illustrated in this Figure) within the optical stack 16 may prevent shorting and control the separation distance between layers 14 and 16, as illustrated by pixel 12b on the right in FIG. 1. The behavior is the same regardless of the polarity of the applied potential difference. In this way, row/column actuation that can control the reflective vs. non-reflective pixel states is analogous in many ways to that used in conventional LCD and other display technologies.

FIGS. 2 through 5B illustrate one exemplary process and system for using an array of interferometric modulators in a display application.

Figure 2:
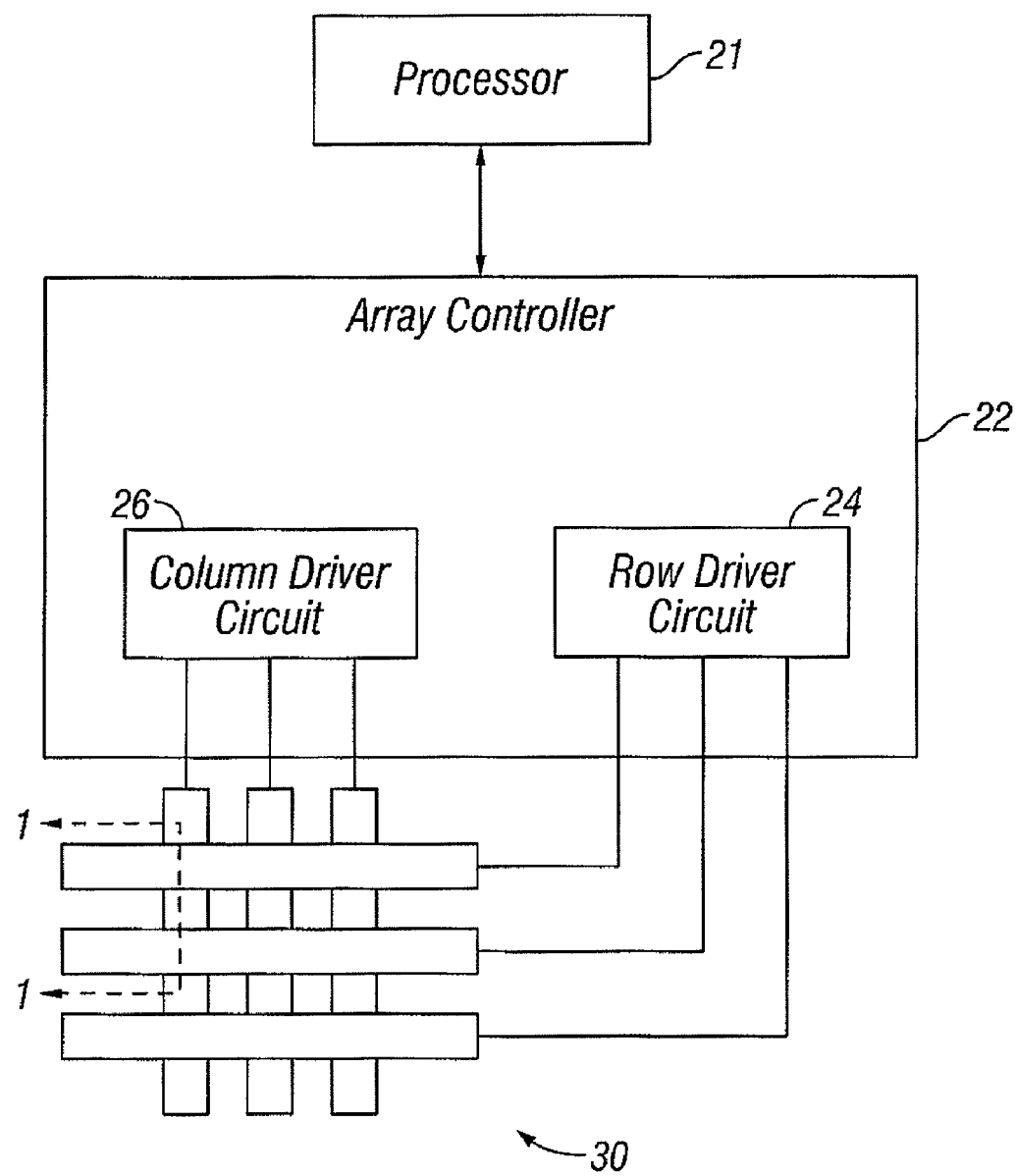
FIG. 2 is a system block diagram illustrating one embodiment of an electronic device incorporating a 3×3 interferometric modulator display.

FIG. 2 is a system block diagram illustrating one embodiment of an electronic device that may incorporate aspects of the invention. In the exemplary embodiment, the electronic device includes a processor 21 which may be any general purpose single- or multi-chip microprocessor such as an ARM, Pentium®, Pentium II®, Pentium III®, Pentium IV®, Pentium® Pro, an 8051, a MIPS®, a Power PC®, an ALPHA®, or any special purpose microprocessor such as a digital signal processor, microcontroller, or a programmable gate array. As is conventional in the art, the processor 21 may be configured to execute one or more software modules. In addition to executing an operating system, the processor may be configured to execute one or more software applications, including a web browser, a telephone application, an email program, or any other software application.

In one embodiment, the processor 21 is also configured to communicate with an array driver 22. In one embodiment, the array driver 22 includes a row driver circuit 24 and a column driver circuit 26 that provide signals to a display array or panel 30. The cross section of the array illustrated in FIG. 1 is shown by the lines 1-1 in FIG. 2. For MEMS interferometric modulators, the row/column actuation protocol may take advantage of a hysteresis property of these devices illustrated in FIG. 3. It may require, for example, a 10 volt potential difference to cause a movable layer to deform from the relaxed state to the actuated state. However, when the voltage is reduced from that value, the movable layer maintains its state as the voltage drops back below 10 volts. In the exemplary embodiment of FIG. 3, the movable layer does not relax completely until the voltage drops below 2 volts. There is thus a range of voltage, about 3 to 7 V in the example illustrated in FIG. 3, where there exists a window of applied voltage within which the device is stable in either the relaxed or actuated state. This is referred to herein as the "hysteresis window" or "stability window." For a display array having the hysteresis characteristics of FIG. 3, the row/column actuation protocol can be designed such that during row strobing, pixels in the strobed row that are to be actuated are exposed to a voltage difference of about 10 volts, and pixels that are to be relaxed are exposed to a voltage difference of close to zero volts. After the strobe, the pixels are exposed to a steady state voltage difference of about 5 volts such that they remain in whatever state the row strobe put them in. After being written, each pixel sees a potential difference within the "stability window" of 3-7 volts in this example. This feature makes the pixel design illustrated in FIG. 1 stable under the same applied voltage conditions in either an actuated or relaxed pre-existing state. Since each pixel of the interferometric modulator, whether in the actuated or relaxed state, is essentially a capacitor formed by the fixed and moving reflective layers, this stable state can be held at a voltage within the hysteresis window with almost no power dissipation. Essentially no current flows into the pixel if the applied potential is fixed.

In typical applications, a display frame may be created by asserting the set of column electrodes in accordance with the desired set of actuated pixels in the first row. A row pulse is then applied to the row 1 electrode, actuating the pixels corresponding to the asserted column lines. The asserted set of column electrodes is then changed to correspond to the desired set of actuated pixels in the second row. A pulse is then applied to the row 2 electrode, actuating the appropriate pixels in row 2 in accordance with the asserted column electrodes. The row 1 pixels are unaffected by the row 2 pulse, and remain in the state they were set to during the row 1 pulse. This may be repeated for the entire series of rows in a sequential fashion to produce the frame. Generally, the frames are refreshed and/or updated with new display data by continually repeating this process at some desired number of frames per second. A wide variety of protocols for driving row and column electrodes of pixel arrays to produce display frames are also well known and may be used in conjunction with the present invention.

Figures 3, 4:
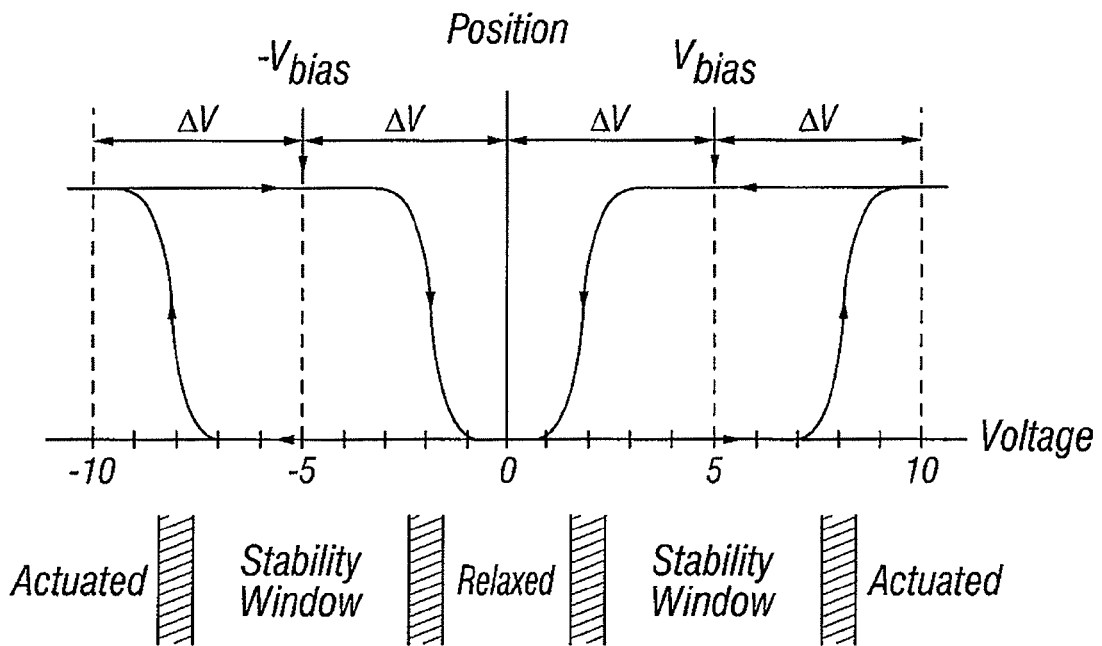
FIG. 3 is a diagram of movable mirror position versus applied voltage for one exemplary embodiment of an interferometric modulator of FIG. 1.
FIG. 4 is an illustration of a set of row and column voltages that may be used to drive an interferometric modulator display.
Figure 5A:
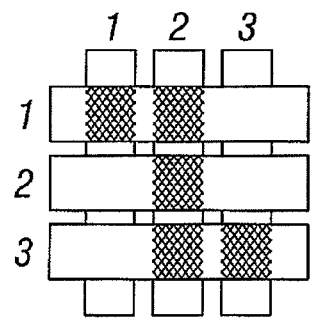
FIG. 5A illustrates one exemplary frame of display data in the 3×3 interferometric modulator display of FIG. 2.
Figure 5B:
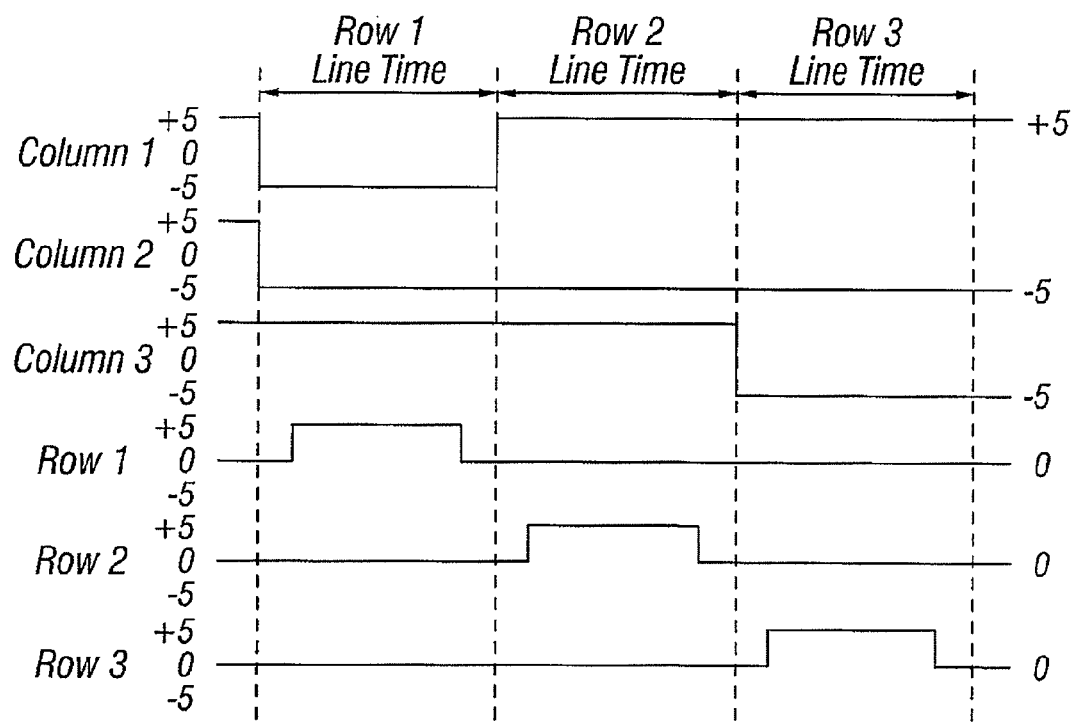
FIG. 5B illustrates one exemplary timing diagram for row and column signals that may be used to write the frame of FIG. 5A FIGS. 6A and 6B are system block diagrams illustrating an embodiment of a visual display device comprising a plurality of interferometric modulators.

FIGS. 4, 5A, and 5B illustrate one possible actuation protocol for creating a display frame on the 3×3 array of FIG. 2. FIG. 4 illustrates a possible set of column and row voltage levels that may be used for pixels exhibiting the hysteresis curves of FIG. 3. In the FIG. 4 embodiment, actuating a pixel involves setting the appropriate column to $-V_{bias}$, and the appropriate row to $+\Delta V$, which may correspond to −5 volts and +5 volts respectively Relaxing the pixel is accomplished by setting the appropriate column to $+V_{bias}$, and the appropriate row to the same $+\Delta V$, producing a zero volt potential difference across the pixel. In those rows where the row voltage is held at zero volts, the pixels are stable in whatever state they were originally in, regardless of whether the column is at $+V_{bias}$, or $-V_{bias}$. As is also illustrated in FIG. 4, it will be appreciated that voltages of opposite polarity than those described above can be used, e.g., actuating a pixel can involve setting the appropriate column to $+V_{bias}$, and the appropriate row to $-\Delta V$. In this embodiment, releasing the pixel is accomplished by setting the appropriate column to −$V_{bias}$, and the appropriate row to the same −ΔV, producing a zero volt potential difference across the pixel.

FIG. 5B is a timing diagram showing a series of row and column signals applied to the 3×3 array of FIG. 2 which will result in the display arrangement illustrated in FIG. 5A, where actuated pixels are non-reflective. Prior to writing the frame illustrated in FIG. 5A, the pixels can be in any state, and in this example, all the rows are at 0 volts, and all the columns are at +5 volts. With these applied voltages, all pixels are stable in their existing actuated or relaxed states.

In the FIG. 5A frame, pixels (1,1), (1,2), (2,2), (3,2) and (3,3) are actuated. To accomplish this, during a "line time" for row 1, columns 1 and 2 are set to −5 volts, and column 3 is set to +5 volts. This does not change the state of any pixels, because all the pixels remain in the 3-7 volt stability window. Row 1 is then strobed with a pulse that goes from 0, up to 5 volts, and back to zero. This actuates the (1,1) and (1,2) pixels and relaxes the (1,3) pixel. No other pixels in the array are affected. To set row 2 as desired, column 2 is set to −5 volts, and columns 1 and 3 are set to +5 volts. The same strobe applied to row 2 will then actuate pixel (2,2) and relax pixels (2,1) and (2,3). Again, no other pixels of the array are affected. Row 3 is similarly set by setting columns 2 and 3 to −5 volts, and column 1 to +5 volts. The row 3 strobe sets the row 3 pixels as shown in FIG. 5A. After writing the frame, the row potentials are zero, and the column potentials can remain at either +5 or −5 volts, and the display is then stable in the arrangement of FIG. 5A. It will be appreciated that the same procedure can be employed for arrays of dozens or hundreds of rows and columns. It will also be appreciated that the timing, sequence, and levels of voltages used to perform row and column actuation can be varied widely within the general principles outlined above, and the above example is exemplary only, and any actuation voltage method can be used with the systems and methods described herein.

Figure 6A:
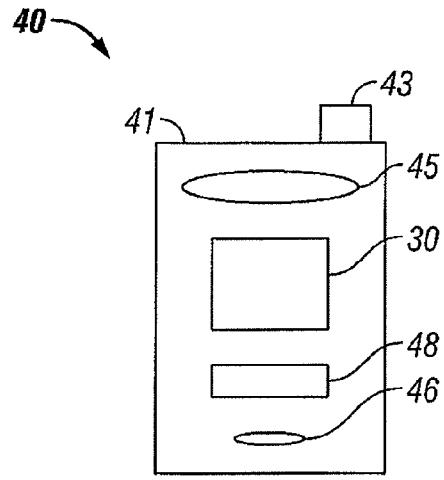
Figure 6B:
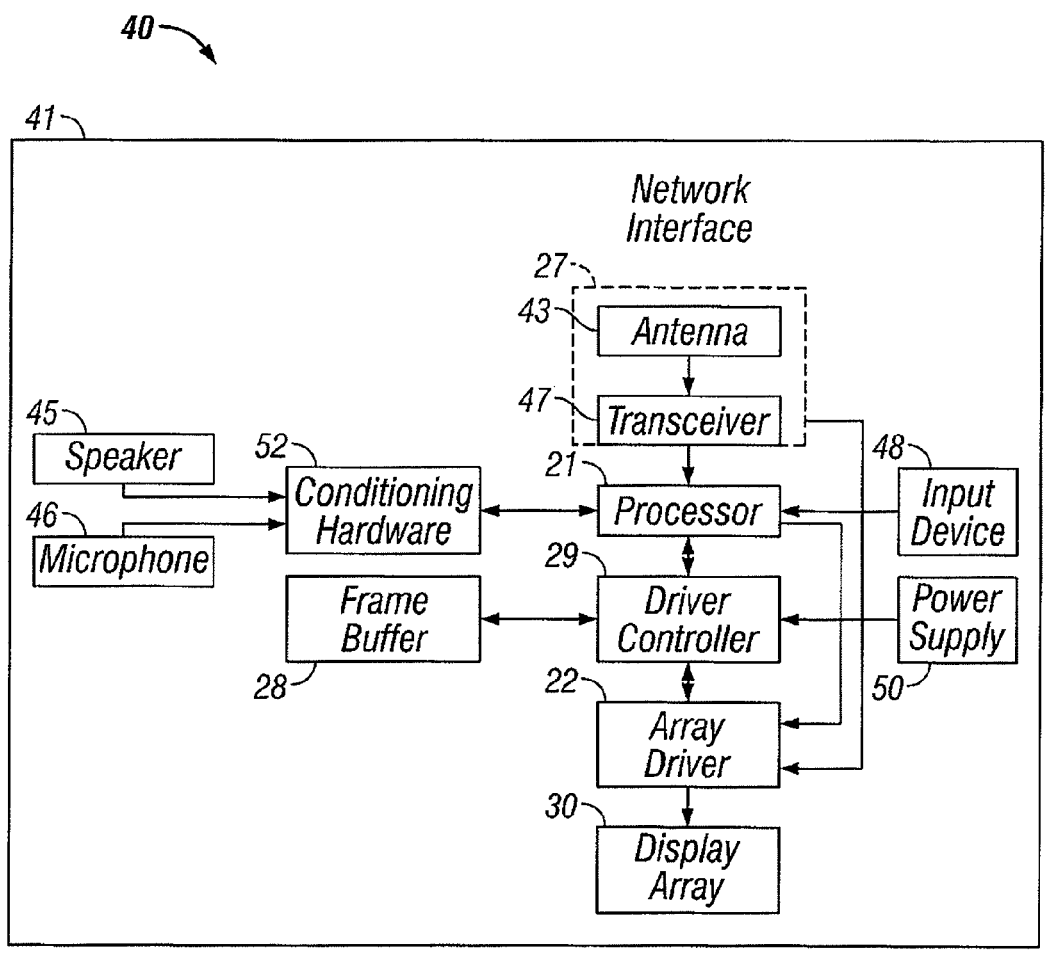

FIGS. 6A and 6B are system block diagrams illustrating an embodiment of a display device 40. The display device 40 can be, for example, a cellular or mobile telephone. However, the same components of display device 40 or slight variations thereof are also illustrative of various types of display devices such as televisions and portable media players.

The display device 40 includes a housing 41, a display 30, an antenna 43, a speaker 45, an input device 48, and a microphone 46. The housing 41 is generally formed from any of a variety of manufacturing processes as are well known to those of skill in the art, including injection molding, and vacuum forming. In addition, the housing 41 may be made from any of a variety of materials, including but not limited to plastic, metal, glass, rubber, and ceramic, or a combination thereof. In one embodiment the housing 41 includes removable portions (not shown) that may be interchanged with other removable portions of different color, or containing different logos, pictures, or symbols.

The display 30 of exemplary display device 40 may be any of a variety of displays, including a bi-stable display, as described herein. In other embodiments, the display 30 includes a flat-panel display, such as plasma, EL, OLED, STN LCD, or TFT LCD as described above, or a non-flat-panel display, such as a CRT or other tube device, as is well known to those of skill in the art. However, for purposes of describing the present embodiment, the display 30 includes an interferometric modulator display, as described herein.

The components of one embodiment of exemplary display device 40 are schematically illustrated in FIG. 6B. The illustrated exemplary display device 40 includes a housing 41 and can include additional components at least partially enclosed therein. For example, in one embodiment, the exemplary display device 40 includes a network interface 27 that includes an antenna 43 which is coupled to a transceiver 47. The transceiver 47 is connected to a processor 21, which is connected to conditioning hardware 52. The conditioning hardware 52 may be configured to condition a signal (e.g. filter a signal). The conditioning hardware 52 is connected to a speaker 45 and a microphone 46. The processor 21 is also connected to an input device 48 and a driver controller 29. The driver controller 29 is coupled to a frame buffer 28, and to an array driver 22, which in turn is coupled to a display array 30. A power supply 50 provides power to all components as required by the particular exemplary display device 40 design.

The network interface 27 includes the antenna 43 and the transceiver 47 so that the exemplary display device 40 can communicate with one ore more device s over a network. In one embodiment the network interface 27 may also have some processing capabilities to relieve requirements of the processor 21. The antenna 43 is any antenna known to those of skill in the art for transmitting and receiving signals. In one embodiment, the antenna transmits and receives RF signals according to the IEEE 802.11 standard, including IEEE 802.11(a), (b), or (g). In another embodiment, the antenna transmits and receives RF signals according to the BLUETOOTH standard. In the case of a cellular telephone, the antenna is designed to receive CDMA, GSM, AMPS or other known signals that are used to communicate within a wireless cell phone network. The transceiver 47 pre-processes the signals received from the antenna 43 so that they may be received by and further manipulated by the processor 21. The transceiver 47 also processes signals received from the processor 21 so that they may be transmitted from the exemplary display device 40 via the antenna 43.

In an alternative embodiment, the transceiver 47 can be replaced by a receiver. In yet another alternative embodiment, network interface 27 can be replaced by an image source, which can store or generate image data to be sent to the processor 21. For example, the image source can be a memory device, such as a digital video disc (DVD) or a hard-disc drive that contains image data, or a software module that generates image data.

Processor 21 generally controls the overall operation of the exemplary display device 40. The processor 21 receives data, such as compressed image data from the network interface 27 or an image source, and processes the data into raw image data or into a format that is readily processed into raw image data. The processor 21 then sends the processed data to the driver controller 29 or to frame buffer 28 for storage. Raw data typically refers to the information that identifies the image characteristics at each location within an image. For example, such image characteristics can include color, saturation, and gray-scale level.

In one embodiment, the processor 21 includes a microcontroller, CPU, or logic unit to control operation of the exemplary display device 40. Conditioning hardware 52 generally includes amplifiers and filters for transmitting signals to the speaker 45, and for receiving signals from the microphone 46. Conditioning hardware 52 may be discrete components within the exemplary display device 40, or may be incorporated within the processor 21 or other components.

The driver controller 29 takes the raw image data generated by the processor 21 either directly from the processor 21 or from the frame buffer 28 and reformats the raw image data appropriately for high speed transmission to the array driver 22. Specifically, the driver controller 29 reformats the raw image data into a data flow having a raster-like format, such that it has a time order suitable for scanning across the display array 30. Then the driver controller 29 sends the formatted information to the array driver 22. Although a driver controller 29, such as a LCD controller, is often associated with the system processor 21 as a stand-alone Integrated Circuit (IC), such controllers may be implemented in many ways. They may be embedded in the processor 21 as hardware, embedded in the processor 21 as software, or fully integrated in hardware with the array driver 22.

Typically, the array driver 22 receives the formatted information from the driver controller 29 and reformats the video data into a parallel set of waveforms that are applied many times per second to the hundreds and sometimes thousands of leads coming from the display's x-y matrix of pixels.

In one embodiment, the driver controller 29, array driver 22, and display array 30 are appropriate for any of the types of displays described herein. For example, in one embodiment, driver controller 29 is a conventional display controller or a bi-stable display controller (e.g., an interferometric modulator controller). In another embodiment, array driver 22 is a conventional driver or a bi-stable display driver (e.g., an interferometric modulator display). In one embodiment, a driver controller 29 is integrated with the array driver 22. Such an embodiment is common in highly integrated systems such as cellular phones, watches, and other small area displays. In yet another embodiment, display array 30 is a typical display array or a bi-stable display array (e.g., a display including an array of interferometric modulators).

The input device 48 allows a user to control the operation of the exemplary display device 40. In one embodiment, input device 48 includes a keypad, such as a QWERTY keyboard or a telephone keypad, a button, a switch, a touch-sensitive screen, a pressure- or heat-sensitive membrane. In one embodiment, the microphone 46 is an input device for the exemplary display device 40. When the microphone 46 is used to input data to the device, voice commands may be provided by a user for controlling operations of the exemplary display device 40.

Power supply 50 can include a variety of energy storage devices as are well known in the art. For example, in one embodiment, power supply 50 is a rechargeable battery, such as a nickel-cadmium battery or a lithium ion battery. In another embodiment, power supply 50 is a renewable energy source, a capacitor, or a solar cell, including a plastic solar cell, and solar-cell paint. In another embodiment, power supply 50 is configured to receive power from a wall outlet.

In some implementations control programmability resides, as described above, in a driver controller which can be located in several places in the electronic display system. In some cases control programmability resides in the array driver 22. Those of skill in the art will recognize that the above-described optimization may be implemented in any number of hardware and/or software components and in various configurations.

Figure 7A:
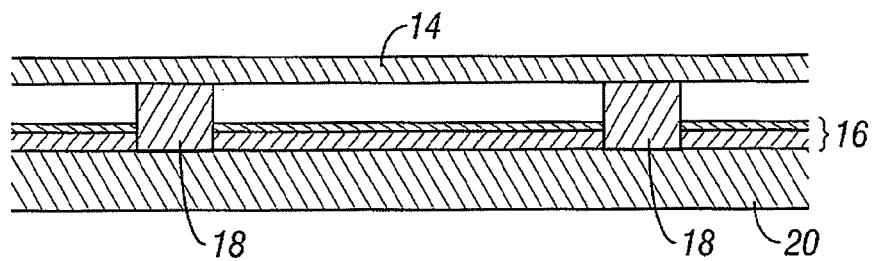
FIG. 7A is a cross section of the device of FIG. 1.
Figure 7B:
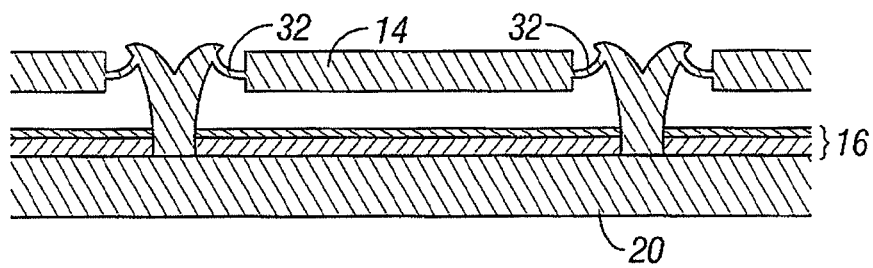
FIG. 7B is a cross section of an alternative embodiment of an interferometric modulator.
Figure 7C:
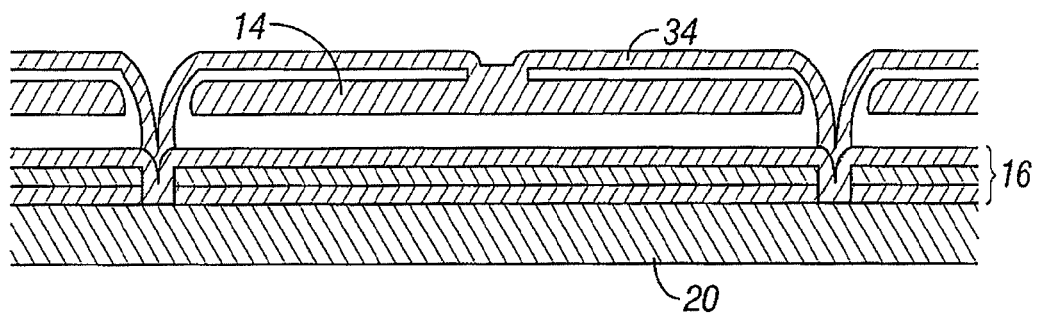
FIG. 7C is a cross section of another alternative embodiment of an interferometric modulator.
Figure 7D:
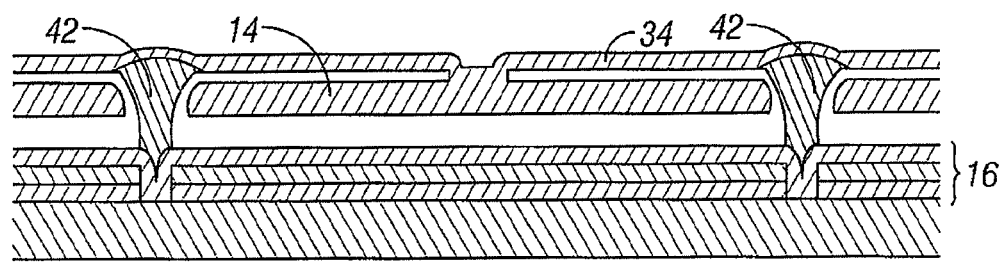
FIG. 7D is a cross section of yet another alternative embodiment of an interferometric modulator.
Figure 7E:
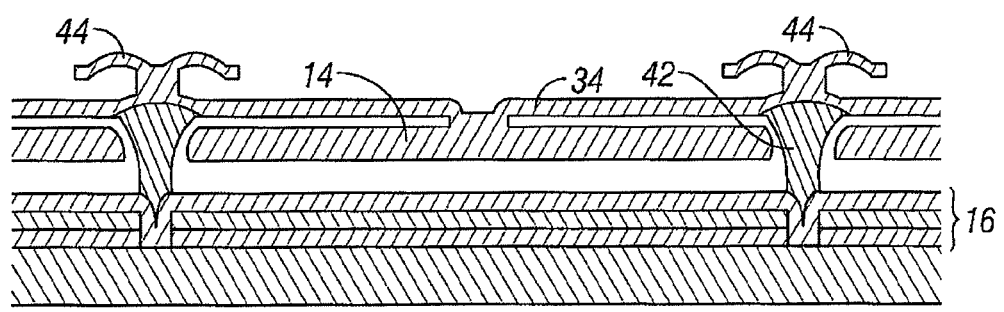
FIG. 7E is a cross section of an additional alternative embodiment of an interferometric modulator.

The details of the structure of interferometric modulators that operate in accordance with the principles set forth above may vary widely. For example, FIGS. 7A-7E illustrate five different embodiments of the movable reflective layer 14 and its supporting structures. FIG. 7A is a cross section of the embodiment of FIG. 1, where a strip of metal material 14 is deposited on orthogonally extending supports 18. In FIG. 7B, the moveable reflective layer 14 is attached to supports at the corners only, on tethers 32. In FIG. 7C, the moveable reflective layer 14 is suspended from a deformable layer 34, which may comprise a flexible metal. The deformable layer 34 connects, directly or indirectly, to the substrate 20 around the perimeter of the deformable layer 34. These connections are herein referred to as support posts. The embodiment illustrated in FIG. 7D has support post plugs 42 upon which the deformable layer 34 rests. The movable reflective layer 14 remains suspended over the cavity, as in FIGS. 7A-7C, but the deformable layer 34 does not form the support posts by filling holes between the deformable layer 34 and the optical stack 16. Rather, the support posts are formed of a planarization material, which is used to form support post plugs 42. The embodiment illustrated in FIG. 7E is based on the embodiment shown in FIG. 7D, but may also be adapted to work with any of the embodiments illustrated in FIGS. 7A-7C as well as additional embodiments not shown. In the embodiment shown in FIG. 7E, an extra layer of metal or other conductive material has been used to form a bus structure 44. This allows signal routing along the back of the interferometric modulators, eliminating a number of electrodes that may otherwise have had to be formed on the substrate 20.

In embodiments such as those shown in FIG. 7, the interferometric modulators function as direct-view devices, in which images are viewed from the front side of the transparent substrate 20, the side opposite to that upon which the modulator is arranged. In these embodiments, the reflective layer 14 optically shields the portions of the interferometric modulator on the side of the reflective layer opposite the substrate 20, including the deformable layer 34. This allows the shielded areas to be configured and operated upon without negatively affecting the image quality. Such shielding allows the bus structure 44 in FIG. 7E, which provides the ability to separate the optical properties of the modulator from the electromechanical properties of the modulator, such as addressing and the movements that result from that addressing. This separable modulator architecture allows the structural design and materials used for the electromechanical aspects and the optical aspects of the modulator to be selected and to function independently of each other. Moreover, the embodiments shown in FIGS. 7C-7E have additional benefits deriving from the decoupling of the optical properties of the reflective layer 14 from its mechanical properties, which are carried out by the deformable layer 34. This allows the structural design and materials used for the reflective layer 14 to be optimized with respect to the optical properties, and the structural design and materials used for the deformable layer 34 to be optimized with respect to desired mechanical properties.

Figure 8A:
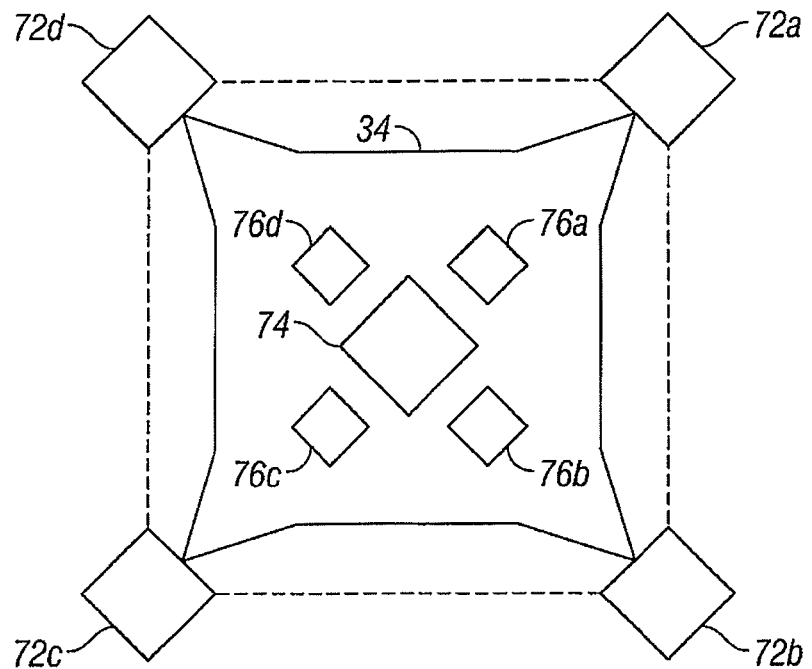
FIG. 8A is a schematic diagram illustrating an embodiment of a back plane support for a separable interferometric modulator.
Figure 8B:
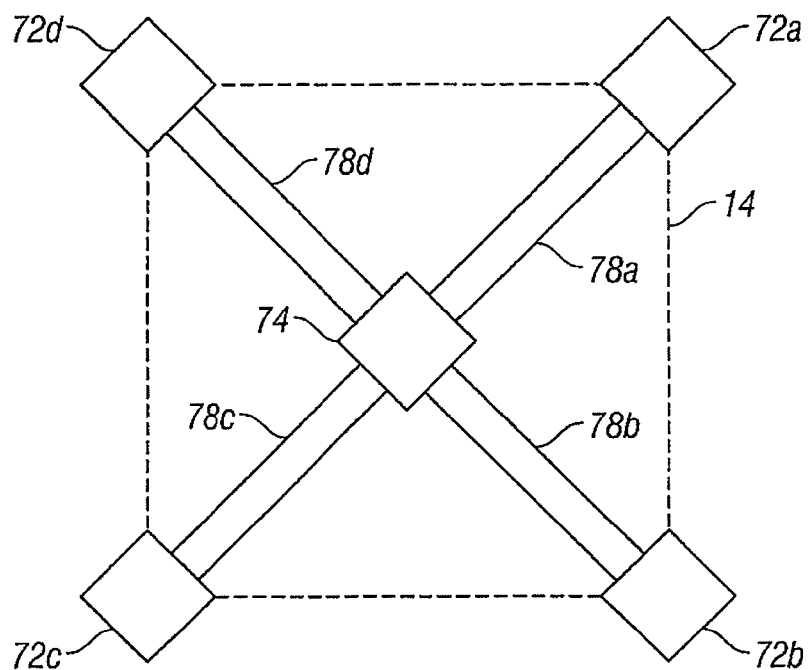
FIG. 8B is a schematic diagram illustrating an alternative embodiment of a back plane of a separable interferometric modulator.

Possible configurations for deformable layer 34 are shown in FIGS. 8a and 8b, which depict views from the back of the modulator, which may also be seen as the bottom of the modulator shown in FIG. 1, or the top of the modulators shown in FIGS. 7A-7E. In FIG. 8A, the deformable layer 34 is in the form of a flexible membrane supported at its corners by support posts 72a-d, which are anchored in the substrate 20 and/or a layer above the substrate 20, such as the optical stack 16 (see cross-sectional views of FIG. 7). In the embodiments illustrated in FIGS. 7D and 7E, the support posts 72a-d include the support post plugs 42. The deformable layer 34 connects to the underlying reflective layer 14, demarcated by the dotted line in FIG. 8A, via a large center back support 74 and four smaller surrounding supports 76a-d. The back support 74 and the surrounding supports 76a-d can be comprised of the same planarization material as support post plugs 42, or of any suitable material. The deformable layer 34 suspends the reflective layer 14 over the optical stack.

Alternatively, in FIG. 8B, the deformable layer 34 is patterned to form thin, linear straps 78a-d connected to each support post 72a-d. The straps are attached to the reflective layer 14 by the center support 74. The configurations of FIGS. 8A and 8B are two alternatives, among many possibilities. Interferometric modulators useful in the invention may comprise any configuration that gives the desired freedom of movement to the reflective layer 14 and the desired mechanical characteristics of that movement.

The production of various types of interferometric devices is described in a number of published documents, including, for example, published U.S. Patent Application No. 2004/0051929. A wide variety of techniques well known in the art may be used to produce the above described structures, such as methods involving a series of material deposition, patterning, and etching steps. For example, interferometric modulators can be fabricated using semiconductor manufacturing techniques, such as photolithography, deposition (e.g., dry methods, such as chemical vapor deposition (CVD), as well as wet methods, such as spin coating), masking, shadow masking, lift-off processing, and etching (e.g., dry methods, such as plasma etching, as well as wet methods). Examples of suitable techniques are described, for example, in U.S. Pat. No. 6,040,937, issued on Mar. 21, 2000.

Layers, coatings, and/or other structural elements may be described herein as being "on" (e.g., deposited on, or formed on), "over", "above", "adjacent", "between", etc. in relation to other structural elements. As used herein, these terms can mean directly or indirectly on, over, above, adjacent, between, etc., as a variety of intermediate layers and/or other structural elements can be interposed between structural elements recited herein. Similarly, structural elements recited herein, such as substrates or layers, can comprise a single component (e.g., a monolayer) or a multi-component structure (e.g., a laminate comprising multiple layers of the recited material, with or without layers of additional materials). In addition to the above-mentioned connotations, the term "on," as used herein, can denote that a structural element is attached, connected, joined or otherwise associated with another element in any manner maintaining the elements in proximity to one another. A structural element described as "on" another can be integral to, or separate/distinct from the other element, and the elements can be associated permanently, irreversibly, etc., or removably, separably, etc. Use of the term "one or more" with respect to an object or element does not in any way indicate the absence of a potential plural arrangement of objects or elements for which the term is not used. The term "microelectromechanical device," as used herein, refers generally to any such device at any stage of manufacture.

Figure 9A:
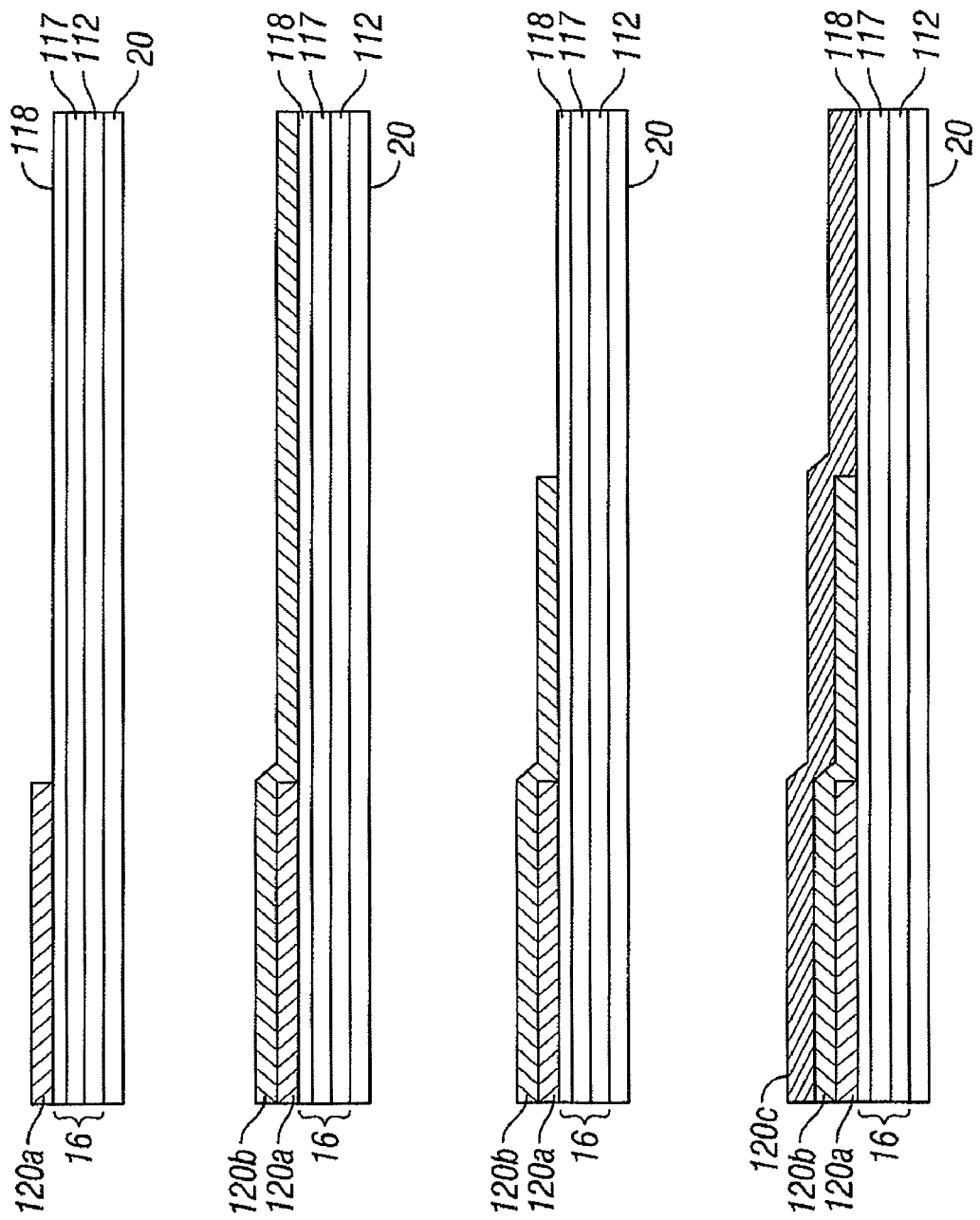
FIG. 9A illustrates the deposition, patterning and etching of multiple sub-layers of sacrificial materials to form interferometric modulators with interferometric cavities of varying dimensions.
Figure 9B:
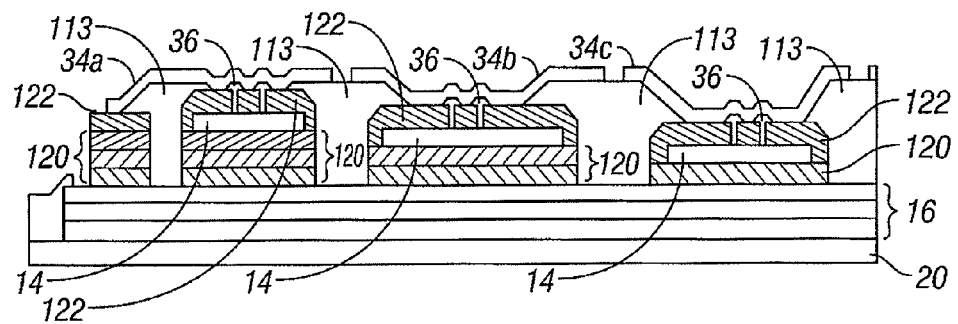
FIG. 9B is a cross sectional view showing three adjacent interferometric modulators comprising a pixel in a color display in the pre-release state of manufacture, prior to etching of the sacrificial layers.
Figure 9C:
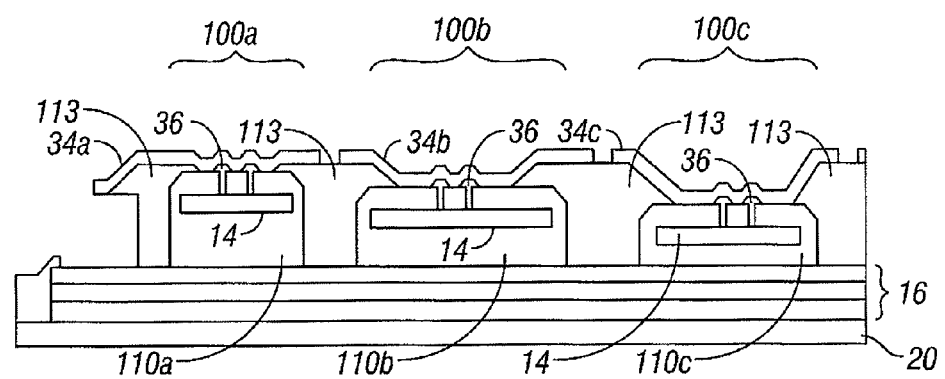
FIG. 9C is a cross sectional view showing the interferometric modulators of FIG. 9B, each in a relaxed state, after release by etching of the sacrificial layers.

FIGS. 9A-C are cross-sectional views illustrating several steps of an exemplary process for forming an array of interferometric modulators, each comprising a movable reflective layer 14 suspended over an optical stack 16 to form an interferometric cavity 110. The cross-sections of FIG. 9 show three interferometric modulators, 100(a), 100(b), and 100(c), which comprise a pixel in a color display device. The final configurations of the interferometric modulators formed by the exemplified process are shown in FIG. 9C. The dimensions of the interferometric cavities of modulators 100(a), 100(b), and 100(c) determine the nature of the interference and the resulting color of light reflected by each modulator. For example, modulators 100(a), 100(b), and 100(c) have interferometric cavities 110(a), 110(b), and 110(c) of varying heights (i.e., distances between the movable reflective layer 14 and the optical stack 16 in the quiescent or relaxed state), with the heights of the cavities correlating with the wavelengths of light reflected. Thus, in an "RGB" pixel example, modulator 100(a) having the cavity with the largest height reflects red light, modulator 100(b) with the cavity of intermediate height reflects green light, and modulator 100(c) with the cavity of the smallest height reflects blue light. Other color combinations are also possible, as well as the use of black and white pixels.

With reference to FIG. 9C, in the illustrated embodiment, the movable reflective layer 14 is suspended over the interferometric cavity by deformable layer 34. In various embodiments, the mechanical properties of the deformable layer 34 determine the position of the movable reflective layer 14 relative to the optical stack 16, and thus the dimensions of the interferometric cavity, when the interferometric modulator is in the quiescent state. As described in more detail below, the mechanical properties of the deformable layer 34 are in turn determined by the dimensions of the interferometric cavity 110 when deformable layer 34 is deposited in the pre-release state. In the pre-release or unreleased state, illustrated in FIG. 9B, the spacing between the movable reflective layers 14 and the optical stack 16 is determined by the thickness of a first sacrificial layer 120 in each interferometric modulator 110 (a)-(c), which may comprise a single layer or two or more sub-layers, as described below.

In the illustrated process, an optical stack 16 is deposited on a transparent substrate 20, as shown in FIG. 9A. The optical stack 16 typically comprises several integrated or fused layers, including an electrode layer 112, formed on the substrate 20 out of an appropriate material, such as indium tin oxide (ITO), and a partially reflective layer 117 formed on top of the electrode layer 112 out of an appropriate material such as chrome. In a process not shown here, the electrode and partially reflective layers 112, 117 are typically patterned and etched to form electrode columns, rows or other useful shapes as required by the display design. The optical stack 16 also typically comprises a dielectric layer 118 formed over the patterned electrode 112 and partially reflective 117 layers. The dielectric layer 118 comprises an appropriate material, such as silicon oxide. In various embodiments, other materials are used to form the electrode, partially reflective, and/or dielectric layers. The viewing surface of the transparent substrate 20 is on the 'bottom' of the substrate 20, the opposite side of the substrate 20 than that upon which the optical stack 16 is formed.

Formation of the optical stack is followed by deposition of a first sacrificial layer 120. As shown in FIG. 9A, multiple sub-layers of sacrificial materials are fabricated, patterned, and etched to create first sacrificial layer(s) 120 of variable thickness. In some embodiments, an etch stop layer (not shown), for example comprising $Al_2O_3$, is formed on the optical stack 16 prior to deposition of the first sacrificial layer to protect the optical stack from subsequent etching steps. In order to produce varying cavity dimensions, the first sacrificial layer 120 may comprise one, two, or three sacrificial sub-layers, 120(a), 120(b), 120(c), respectively. In step 1 of the illustrated embodiment, the first layer 120(a) is deposited, masked and etched to define the area of one of the three modulators forming the pixel. In step 2, a second layer 120(b) is deposited. In step 3, a second mask is applied to sub-layer 120(b), which is patterned to define the combined area of the first modulator defined in step 1, as well as the second modulator forming each pixel. Finally, a third sacrificial sub-layer 120(c) is applied in step 4. The third layer 130(c) need not be patterned, since its thickness is included in all three of the modulators forming the pixel.

The three individual deposited sub-layers 120(a)-120(c) need not be of the same thickness. Thus, the modulators can have a range of cavity heights corresponding to the combined thicknesses of the various layers. For example, adjacent interferometric modulators within a pixel may have a cavity height corresponding to the combined thickness of three layers, the combined thickness of two layers, and/or the thickness of a single sacrificial layer. When the sacrificial layer materials are removed, the height of the first sacrificial layer 120 for each modulator determines the dimensions of the interferometric cavity 110 in the relaxed state (see FIG. 9C). The combined thickness of the one or more layer(s) forming the sacrificial layer 120 can be wide ranging, depending for example on the desired optical and electromechanical properties of the interferometric modulator as well as other considerations. In some embodiments, the sacrificial layer 120 has a combined thickness of from about 500 Angstroms to about 50,000 Angstroms, and more preferably from about several thousand Angstroms to about 10,000 Angstroms.

To form the pre-release structure illustrated in FIG. 9B, a metallic layer is deposited on first sacrificial layer 120 (comprising one, two or three sub-layers), and is subsequently patterned and etched to form the movable reflective layer 14 of each interferometric modulator. In some embodiments, a second etch stop layer (not shown) is deposited between the first sacrificial layer 120 and the metallic layer 114 to protect the first sacrificial layer 120 during the pattern etch. A second sacrificial layer 122 is then deposited (and optionally planarized) on reflective layers 14 and the spaces between the reflective layers 14 (on first sacrificial layer 120). The second sacrificial layer 122 is subsequently masked and the stack is etched to form cavities in which support posts 113 and connections 36 between the reflective layers 14 and the deformable layers 34 are formed. Support posts 113 are typically of a uniform height, achieved for example by a planarization step (e.g., using chemical-mechanical planarization (CMP)) (not shown). The deformable layer is then deposited, patterned, and etched, for example as shown in FIGS. 8A and 8B.

As illustrated in FIG. 9B, the deformable layer 34 forms an elastic connection between the support posts 113 and the movable reflective layers 14. In some embodiments, a third sacrificial layer (not shown) is optionally deposited over the deformable layer 34. Etching of the sacrificial layers 120, 122 "releases" the interferometric modulators so that the movable reflective layers 14 are suspended over the optical stack 16 by deformable layers 34.

In various embodiments, sacrificial layers used in the present invention, such as sacrificial layers 120, 122, and the optional sacrificial layer over deformable layer 34, are comprised of a mixture of two or more materials that have differential responses to one or more etchants and/or etching processes. In some embodiments, selective etching of a sacrificial layer produces a residual layer (hereinafter referred to as a protective coating) on one or more surfaces of the interferometric modulator. For example, with reference to FIG. 9C, selective etching of sacrificial layer 120 can form protective coatings on the surfaces of the movable reflective layer 14 and optical stack 16 exposed to the interferometric cavity 110. Still referring to FIG. 9C, protective coatings can also be formed on surfaces exposed to the second sacrificial layer 122, including the upper surface of movable reflective layer 14 and the lower surface of deformable layer 34. In some embodiments, protective coatings are formed on multiple surfaces exposed to the interferometric cavity 110. In some embodiments, protective coatings are formed on all of the surfaces, or substantially all of the surfaces, exposed to the interferometric cavity 110. In some embodiments, various methods are used to selectively form protective coatings on one or more surfaces of an interferometric modulator. The term "protective coating" does not imply that the function(s) of such coatings are limited to those that are "protective" in nature. Protective coatings referred to herein can serve any desired function consistent with the operation of the MEMS device in which they are incorporated. Advantageously, protective coatings modulate one or more properties of an interferometric modulator, such as optical, thermal, mechanical, and/or electrical properties.

Methods of forming protective coatings via selective etching of multi-component sacrificial layers eliminate the need for the separate deposition of a similar layer, in addition to the sacrificial layer. For example, in some embodiments, a protective layer comprising one or more insulating materials eliminates the need to deposit a dielectric layer (e.g., layer 118 in FIG. 9A) on the optical stack of an interferometric modulator. Advantageously, methods disclosed herein allow for the formation of protective coatings without the need for substantially departing from established methods for manufacturing interferometric modulators. For example, in some embodiments, protective coatings are formed during the release step (or a modified release step). Moreover, selective etching of multi-component sacrificial layers can also avoid deposition and subsequent removal of an etch stop layer where the separately deposited layer comprises materials susceptible to etching processes used in the manufacture of the interferometric modulator. Methods described herein may also allow for the formation of protective coatings that would otherwise be difficult to form using standard deposition processes.

In various embodiments, the multi-component sacrificial layers of the invention are comprised of a sacrificial material and one or more protective materials, wherein the protective materials comprise the protective coating after selective etching of the sacrificial material. In some embodiments, the sacrificial material and the protective materials are deposited as a substantially uniform mixture or suspension, for example by sputtering a composite target comprising the sacrificial and protective materials. In other embodiments, the sacrificial material and protective materials are mixed during the depositions process, for example by chemical vapor deposition (CVD). The mixture of the protective material and sacrificial material is formed by any means known in the art, for example, physical vapor deposition (PVD) (e.g., sputtering, evaporative deposition, pulsed laser deposition), chemical vapor deposition (CVD), plasma enhanced CVD (PECVD), low pressure CVD (LPCVD), electrochemical methods, ion implantation, atomic layer deposition, diffusion, and the like. In some embodiments, the sacrificial layer comprises a material, such as a polymer, that forms a porous matrix upon deposition. In these embodiments, a liquid or gaseous protective material can be infused into the porous sacrificial layer to form a multi-component sacrificial layer.

In various embodiments, the protective materials can be uniformly distributed in the multi-component sacrificial layer or non-uniformly distributed within the sacrificial layer. For example, the protective materials may be concentrated within a portion of the sacrificial layer in contact with or close proximity to one or more surfaces on which a protective coating is to be formed. In some embodiments, the proportion of sacrificial material to protective material varies in a gradient, for example with the proportion of protective material increasing towards one or more surfaces on which a protective coating is to be formed and decreasing towards areas that are completely removed in subsequent etching steps.

In various embodiments, protective coatings described herein can be continuous or discontinuous, uniform or non-uniform, and/or comprised of isolated or agglomerated particles. In some preferred embodiments, protective coatings described herein comprise a relatively thin layer of material, such that the protective coating can serve its intended function with minimal interference with other properties or functions of the interferometric modulator. Preferably, the protective coatings of the invention are between about 50 and about 500 angstroms thick, and more preferably between about 100 and 300 angstroms thick. Various etching methods can be used to form protective coatings of a desired thickness, such as timed etches or processes in which the extent of etching during the "release" etch is monitored, for example by measuring optical properties of the interferometric modulator. In some embodiments, the protective coating will have a non-uniform thickness, for example due to differential exposure to the etchants during removal of differential thicknesses of sacrificial material. In some embodiments, protective coatings are subsequently processed (e.g., via planarization, laser ablation, or other suitable technique) to form uniform coatings, or to selectively remove materials from particular surfaces or portions of the interferometric modulator. In certain embodiments, a non-uniform protective coating may be desirable, for example to reduce stiction between two or more movable surfaces that come into contact during operation of an interferometric modulator. For example, in some embodiments, particles comprising a protective coating can locally deform the mechanical layer of an interferometric modulator (e.g., layer 34 in FIG. 9B), thus increasing its strain energy, enhancing its restoring force and consequently reducing its propensity for stiction. In some embodiments, protective coatings comprising such particles also reduce stiction by decreasing the contact area between the mirror and the underlying dielectric layer (e.g., layer 118 in FIG. 9A), and/or reducing the surface energy of the mirror and/or dielectric layers (e.g., by using particles comprised of low surface energy materials).

In certain embodiments, a multi-component sacrificial layer can comprise a composite or mixture of a protective material and a sacrificial material at or above the percolation threshold of the protective material. Etching of such a layer can produce a substantially continuous network of the protective material throughout the space occupied by the multi-component sacrificial layer prior to etching. In some embodiments, the percolation threshold is from about 30 mol % to 40 mol %. However, the actual value of the percolation threshold will depend on the identities and properties of the materials utilized. In some embodiments, the protective material is preferably below the percolation threshold, which allows for the formation of protective coatings that line one or more surfaces that were in contact with the multi-component layer prior to etching without occupying the entire space occupied by the multi-component layer.

The protective material(s) and sacrificial material(s) comprising the multi-component sacrificial layers of the invention are preferably selected such that the sacrificial materials are selectively and/or preferentially etchable over the protective materials. The sacrificial material is selectively or preferentially etchable relative to a protective material if the sacrificial material is etched at a substantially greater rate than the protective material (e.g., at a rate of greater than about 5×, preferably more than about 10×, and more preferably greater than 40× the rate of the protective material). The protective material is thus substantially resistant to etching under conditions under which the sacrificial layer is substantially susceptible to etching. Those skilled in the art will understand that the selection of the sacrificial materials and protective materials depends on a variety of factors, including the methods and conditions used to deposit the materials (which can effect the physical and/or chemical properties of the materials), and the etching conditions used to remove the sacrificial material, including the nature of the etching process and the identity of the etchants. Those skilled in the art will also understand that all materials are etchable under the appropriate conditions and that the description herein of a material as preferentially or selectively etchable or etch resistant is in comparison with the other materials present in the device under the particular conditions to which the materials are exposed. Thus, in many instances, the selection of sacrificial materials that are selectively or preferentially etchable relative to protective materials is determined empirically, under controlled conditions. Alternatively, a wide variety of etching methods, systems and materials that provide for selective etching of materials of interest are known in the art and/or commercially available.

The protective materials of the invention are also selected so as to be suitable for forming protective coatings, via methods described herein, which have the desired functions and/or properties at desired location(s) within the MEMS device. In general, protective coatings may comprise any material suitable for performing the desired functions of the protective layer. Examples of materials useful for forming protective coatings are described in more detail below. The range of materials that may comprise a protective coating on a surface of an interferometric modulator varies depending on whether the protective coating is within the optical path of the interferometric modulator. As described above with reference to FIG. 1, interferometric modulators typically reflect light from the movable reflective layer 14 that interferes in various degrees with light reflected by the optical stack 16, which is partially reflective and partially transmissive to incident light. Thus, for example, protective coatings formed on the optical stack 16 and/or the reflective surface of movable reflective layer 14 preferably have optical properties consistent with the desired optical response of the interferometric modulator. In some embodiments, protective coatings of the invention may modulate the optical properties of one or more surfaces, such as the ability of a surface to reflect, absorb, scatter, and/or transmit particular wavelengths of light. In contrast, portions of the interferometric modulator on the side of the movable reflective layer 14 opposite the viewing surface are outside of the optical path, and thus protective coatings formed on surfaces that are optically shielded by reflective layer 14 may be selected without regard to their optical properties.

As described above, the selection of sacrificial materials and protective materials comprising multi-component sacrificial layers may require empirical determination of the relative etch rates of the materials under defined conditions. Accordingly, the examples described herein provide general guidelines for the selection of such materials, but should not be construed as universally applicable.

Examples of sacrificial materials useful in the present invention include, but are not limited to, polycrystalline silicon, amorphous silicon, titanium, zirconium, hafnium, vanadium, tantalum, chromium, molybdenum, tungsten, manganese, polymers, and combinations thereof. Suitable polymers are known in the art and include, for example, polymethylmethacrylate (PMMA), polyimide, and photoresists (e.g., Shipley 3612, Futurrex NR-350P). Examples of protective materials useful to form protective coatings on optically active surfaces include, for example, $Al_2O_3$, $Si_3N_4$, $SiO_2$, $ZrO_2$, $PbO_2$, tantalum pentoxide, diamond and diamond-like materials (e.g., diamond-like carbon (DLC), amorphous carbon (α-C), cubic boron nitride (CBN)), and other suitable materials. Protective materials used to form protective coatings on surfaces outside the optical path may comprise any material that confers the desired functional properties to the protective coating. Examples of such materials include, for example, various polymers (e.g., hydrophobic polymers), microparticles (e.g., silicon-based nanoparticles), polystyrene, polymethylmethacrylate (PMMA), $SiO_2$, $ZrO_2$, PbO2, $Al_2O_3$, $CrO_3$, $Si_3N_4$, $Al_2O_3$, $SiO_2$, tantalum pentoxide, diamond and diamond-like materials (e.g., diamond-like carbon (DLC) (e.g., "Diamonex DLC"), amorphous carbon ($\alpha$-C), cubic boron nitride (CBN)), metals (e.g., tungsten, gold, platinum, chromium, aluminum, hafnium, zirconium, copper, germanium, nickel, silver, tin, titanium, zinc), silicon, metal oxides, silicon oxides, ceramics, plastics, organic polymers, and mixtures and/or alloys thereof.

Various etching processes and etchants may be utilized to form the protective coatings of the invention, and are preferably selected so as to selectively etch the sacrificial materials of the multi-component sacrificial layers. Suitable etching methods are known in the art, for example, wet methods, dry methods, electrochemical methods, and combinations thereof may be employed to etch multi-component sacrificial layers. Suitable etching methods can be anisotropic in nature (i.e. non-directional), or isotropic in nature (i.e. directional). An exemplary wet etchant is a phosphoric/acetic/nitric acid or "PAN" etchant, which selectively removes Mo relative to various materials, including but not limited to, silicon oxide, silicon nitride, titanium and amorphous silicon. Other wet etchants useful in the manufacture of MEMS devices include "HNA" (mixtures of hydrofluoric, nitric and acetic acids), buffered oxide etch (BOE), KOH, acetone and N-methyl pyrrolidinone (NMP) (e.g., to remove sacrificial photoresist materials). Exemplary wet etchants for molybdenum, polysilicon, silicon, and tungsten sacrificial materials are: molybdenum—$HCl:H_2O_2$ (1:1) or $H_2SO_4:HNO_3$:water (1:1:1); polysilicon—$HNO_3$:HF (3:1) or $HNO_3$:HF:Acetic Acid (5:3:3); silicon—$HF:HNO_3$:Water (2:2:1); tungsten—$HF:HNO_3$ (1:1). Wet etching processes are typically isotropic.

Useful dry etching methods include chemical processes (e.g., vapor phase etching), physical processes (e.g., sputtering, ion beam milling), and/or physical and chemical processes (e.g., reactive ion etching). Dry etching processes can be isotropic or anisotropic, with chemical processes typically being isotropic and physical processes being isotropic and/or anisotropic. Physical dry etching processes typically involve energizing gaseous etchants (e.g., with a radiofrequency (RF) energy source) to produce reactive ion species, such as in a plasma, which collide with sacrificial and/or protective materials to form volatile products that are removed, for example by a vacuum source. In some embodiments, the collision of etchants with a multi-component sacrificial layer ejects protective materials species that are relatively unstable, and which subsequently condense (physisorb), chemisorb, otherwise physically adhere or react to form a solid phase upon colliding with one or more surfaces of the interferometric modulator, forming a protective coating. Anisotropic etching techniques are known in the art. For example, the surface to be etched can be attached to an electrode, causing energized ions to bombard the surface from a particular direction. In this manner, a sacrificial layer can be selectively etched in a direction of interest, for example perpendicular to the surface of the sacrificial layer.

Chemical dry etching processes typically involve adsorption of gaseous, chemically reactive etchants on the surface of a sacrificial layer, followed by chemical conversion of sacrificial and/or protective materials into volatile products that are removed, for example by a vacuum source. In some embodiments, the protective materials comprising a multi-component sacrificial layer are substantially less reactive than the sacrificial materials, resulting in selective removal of the sacrificial materials. In some embodiments, selective chemical etching of a multi-component sacrificial layer forms a protective coating comprising a material that is chemically and/or physically distinct from the protective material(s) comprising the multi-component layer. Chemical etching processes are typically isotropic. In some embodiments, selective etching of a multi-component sacrificial layer(s) within the interferometric cavity is preferably performed using an isotropic process. In other embodiments, where an anisotropic method is used to etch a sacrificial layer within the interferometric cavity, the anisotropic etch may be followed by a brief isotropic etch to remove residual materials from the interferometric cavity or other portion of the interferometric modulator.

Examples of etchants useful in dry etching methods include mixtures of one or more gases, for example mixtures of an inert gas (e.g., Xe or Ar) with, e.g., $N_2$, $F_2$, $H_2$, CO, $Cl_2$, $N_xF_y$ (e.g., $NF_3$), $C_xF_y$ (e.g., $C_2F_6$), and/or $Si_xF_y$ (e.g., $SiF_4$). For example, in various embodiments, gaseous or vaporous $XeF_2$ is used as a dry etchant to selectively remove molybdenum, silicon, titanium or tungsten sacrificial layers relative to protective materials including, but not limited to, $Si_3N_4$, $SiO_2$, Al, $Al_2O_3$, Au, Ga, Ni, Pt, Cu, Cr, TiNi alloy, SiC, photoresist, phosphosilicate glass, boron phosphosilicate glass, and polyimides Those of skill in the art understand that $XeF_2$ may serve as a source of fluorine-containing gases, such as $F_2$ and HF, which may be used in place of or in addition to $XeF_2$ as an etchant for sacrificial materials etchable in $XeF_2$. In another exemplary method, HF gas can be used to preferentially etch silicon oxide with respect to polystyrene and/or polymethylmethacrylate (PMMA). In other embodiments, polymeric and/or organic layers may be etched with an organic solvent, or with an ashing technique. For example, plasma etching with $O_2$ and/or $CF_4$ can be used to remove photoresists and organic polymers, such as polyimide, crystalline silicon, silicon dioxide, silicon nitride, and tungsten. Other useful gas phase etchants include $BrF_3$, $ClF_3$, $BrF_5$, and $IF_5$, which can be used to etch silicon and various organic polymers. In some embodiments, the etching of multi-component sacrificial layers to form protective coatings is a multi-step process using one or more etching techniques and/or etchants, for example an anisotropic etch followed by an isotropic etch.

In some embodiments, the etching is monitored, for example, by monitoring the reflectivity of the device, or the etching products released. In other embodiments, the etching is allowed to proceed for a predetermined time. Those skilled in the art will understand that the etching rate of a layer of sacrificial material depends on the thickness of the layer. In general, a thicker layer will etch more slowly than a thinner layer. In some embodiments, the tolerances of the manufacturing process provide sufficient reproducibility in the etching step.

Figure 10A:
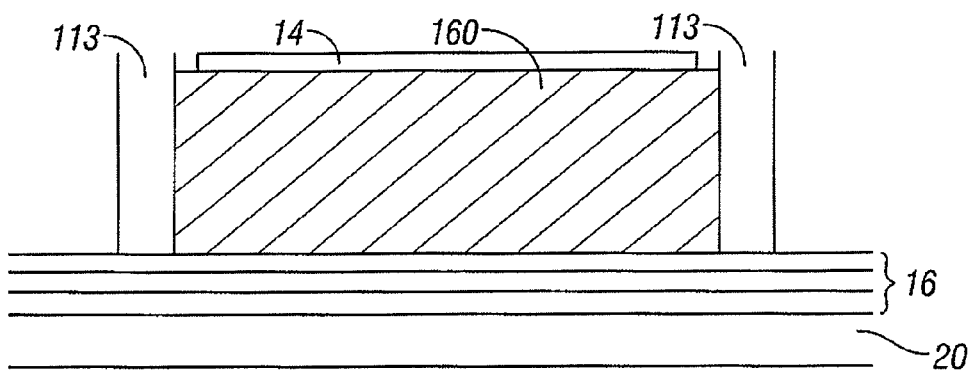
FIGS. 10A and 10B are cross-sectional views of the interferometric cavity of an interferometric modulator illustrating the formation of a protective coating on the surfaces of the interferometric cavity.
Figure 10B:
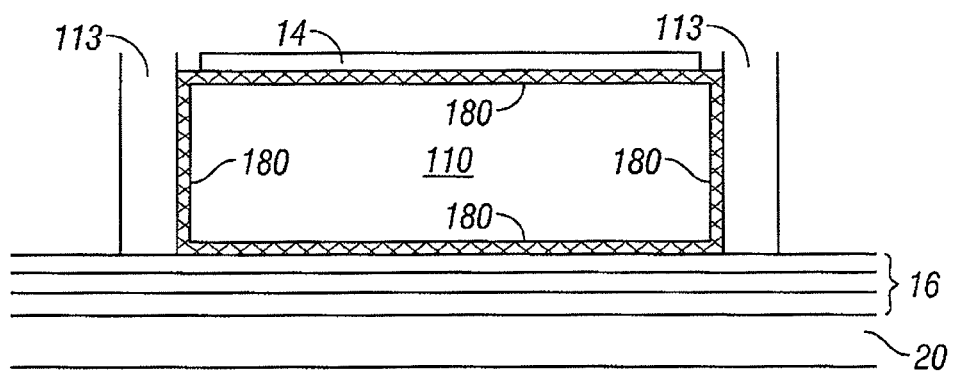

FIGS. 10A and 10B are cross-sectional views of the interferometric cavity 110 of an interferometric modulator in the pre-release and post-release stages of manufacture, illustrating an exemplary embodiment for forming a protective coating. FIG. 10 illustrates the formation of protective coatings comprising a dielectric material on the interior surfaces of the interferometric cavity 110 upon selective/preferential etching of a multi-component sacrificial layer. In the illustrated embodiment, a multi-component sacrificial layer 160 (FIG. 10A) comprising a dielectric protective material ($Si_3N_4$) and a sacrificial material (molybdenum) has been deposited on the upper surface of the optical stack 16 (i.e., the surface normally exposed to interferometric cavity 110). In other embodiments, a multi-component sacrificial layer may be deposited on other surfaces, such as the upper layer of reflective layer 14, and/or sacrificial layer 160 may comprise multiple sub-layers, for example layers formed in a manner similar to sub-layers 120(a) and 120(b) in FIG. 9B. The sacrificial layer 160 is etched via ME using $XeF_2$ to preferentially remove the molybdenum sacrificial material relative to the $Si_3N_4$ protective material. While not limited to a particular mechanism, in the illustrated embodiment, the molybdenum sacrificial materials are converted by chemical and/or physical etching processes to reactive species that are removed, for example with a vacuum source, whereas the $Si_3N_4$ protective materials are converted to less stable energized species that condense upon collision with the surfaces of interferometric cavity 110 to form $Si_3N_4$ dielectric coatings 180 (FIG. 10B) on the interior surfaces of the cavity 110. In some embodiments, subsequent processing steps (not shown) are performed on the protective coatings 180, for example to produce coatings of a desired thickness and/or uniformity.

Other dielectric materials may also be used to form protective coatings. Preferably, the dielectric material is a low dielectric constant material, which may include porous dielectric materials (e.g. aerogels), modified silicon oxides, or other suitable materials. U.S. Pat. Nos. 6,171,945 and 6,660,656 describe low dielectric constant materials and methods for making them. Preferred low dielectric constant materials have a dielectric constant of about 3.3 or less, more preferably about 3.0 or less, and are selected such that the sacrificial materials comprising the sacrificial layer are selectively/preferentially etchable relative to the dielectric material(s) using the etchant and etching processes utilized in the manufacture of the interferometric modulator.

Figure 11A:
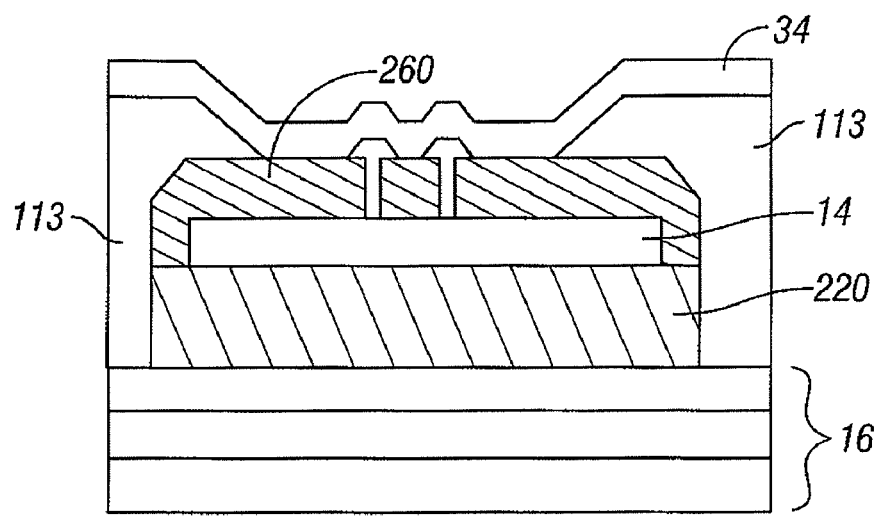
FIGS. 11A and 11B are cross-sectional views of an interferometric modulator illustrating the formation of a protective coating on all of the surfaces exposed to the interferometric cavity.
Figure 11B:
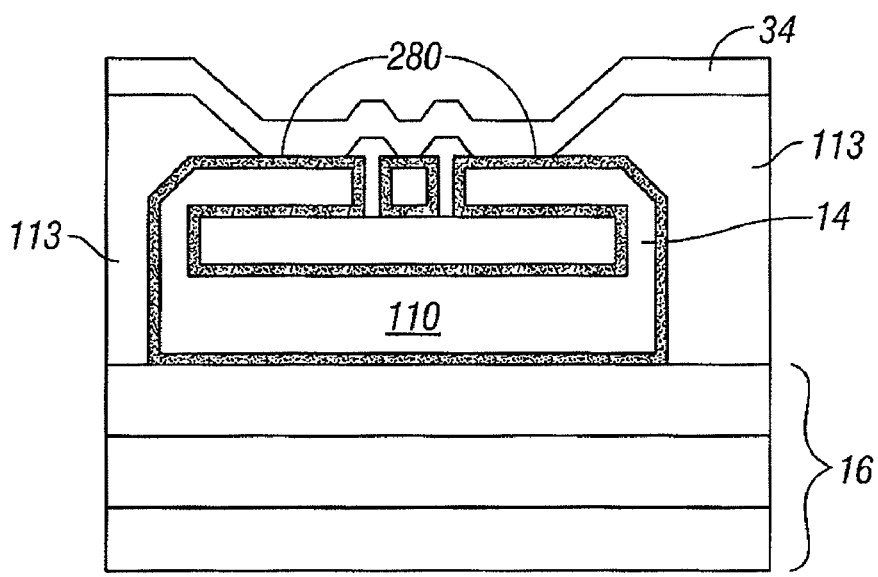

FIGS. 11A and 11B are cross-sectional views of an interferometric modulator in the pre-release and post-release stages of manufacture, respectively, illustrating the formation of an anti-stiction protective coating comprising PMMA on all of the surfaces exposed to the interferometric cavity 110 (FIG. 11B). A multi-component sacrificial layer 220 comprising an organic sacrificial material (polyimide) and an anti-stiction protective material (PMMA) is deposited on the upper surface of the optical stack 16 (i.e., the surface normally exposed to interferometric cavity 110), followed by deposition of a metallic layer, which is patterned and etched to form the movable reflective layer 14. A second multi-component sacrificial layer 260 is then deposited on the movable reflective layer 14 and the spaces between the movable reflective layer 14 and support posts 113. The multi-component sacrificial layers 220, 260 are then etched via $O_2$ plasma etching to preferentially remove the polyimide sacrificial material relative to the PMMA protective material, forming a protective coating 280 comprising the PMMA protective material on all of the surfaces exposed to the interferometric cavity 110, including the exposed surfaces of the optical stack 16, the support posts 113, and the deformable layer 34. In the illustrated embodiment, both sacrificial layers 220, 260 are of the same composition, such that the protective coating 280 has a substantially uniform composition. In other embodiments (not shown), sacrificial layers 220, 260 may have different compositions, allowing formation of protective coatings having different properties on various surfaces and/or locations. While not limited to a particular mechanism, in the illustrated embodiment, the polyimide sacrificial materials are converted by the $O_2$ plasma etching process to volatile species that are removed, for example with a vacuum source, whereas PMMA species condense on exposed surfaces to form a protective coating 280 on the interior surfaces of the interferometric cavity 110. The PMMA coating may be discontinuous and/or non-uniform.

In various embodiments, protective coatings are formed selectively on one or more surfaces of an interferometric modulator. For example, in some embodiments, protective coatings are selectively formed on certain surfaces by masking and patterning portions of the sacrificial layer prior to an etching step to selectively etch portions of the sacrificial layer (not shown). In some embodiments, a sacrificial layer is masked and patterned, and the exposed portions of the sacrificial layers are modified and/or treated, for example to render the untreated portions selectively etchable compared to the treated portions. Those skilled in the art will understand that the particular treatment depends on the type of material(s) comprising the sacrificial layer. For example, in some embodiments, the sacrificial material is a photoreactive polymer, for example, a photoresist. Suitably irradiating exposed portions of the sacrificial layer renders portions of the photoreactive polymer resistant to conditions suitable for etching, ashing, or otherwise removing the non-irradiated portions of the sacrificial layer, for example, developing a photoresist. As is known in the art, the type of irradiation used depends on the particular photoreactive polymer used. For example, positive and negative resists are available for use with ultraviolet (UV) radiation and electron beams.

In various embodiments, patterning and masking techniques are used in combination with the deposition of one or more etch stop layers, which are highly resistant to certain etching techniques, to protect portions of a sacrificial layer or sub-layer. Suitable materials for etch stop layers are known in the art and include, for example, $Al_2O_3$, titanium, silicon dioxide, tungsten, amorphous silicon, germanium, and combinations thereof.

As mentioned above, protective coatings can also be selectively formed on certain surfaces using multi-component sacrificial layers wherein the protective material is non-uniformly distributed within the layer, such as a layer having a gradient with increasing proportions of the protective material in contact with or in close proximity to a surface of interest. Where the sacrificial material is selectively etchable relative to the protective material, such a gradient can facilitate the formation of a protective layer on the surface of interest, for example by allowing for more rapid removal of the multi-component layer in regions where the proportion of protective material is relatively low. Use of a gradient with increasing proportions of protective material in proximity to a surface of interest can also allow for the formation of protective coatings with enhanced density.

Additional processes known in the art may also be used to selectively form the protective coatings on certain surfaces, as can combinations of the above methods and/or methods known in the art.

Protective coatings as described herein can be formed on any surface of a MEMS device that contacts a sacrificial layer during the manufacturing process. For example, with reference to FIGS. 9 and 11, in various embodiments, a protective coating is formed on one or more surfaces of an interferometric modulator exposed to the interferometric cavity 110, including the reflective surface of the movable reflective layer 14 and the exposed surface of the optical stack 16, and/or one or more surfaces behind (i.e., the side opposite the viewing surface) reflective layer 14. In various embodiments, protective coatings on these surfaces modulate one or more properties of the interferometric modulator. For example, in some embodiments, protective coatings formed on one or more surface of an interferometric modulator perform an anti-stiction/passivation function. Problems due to stiction, whereby elements of the device stick to other components due to a variety of causes, including static electricity, surface contact forces (e.g., van der Walls forces), capillary forces (e.g., due to humidity or wet etchants), etc. commonly arise during manufacture and/or operation of MEMS devices, and can require additional and time consuming process steps to prevent them. Advantageously, methods disclosed herein allow for the formation of anti-stiction coatings without the need for substantially departing from established manufacturing methods. With respect to MEMS devices, protective coatings described herein may also dissipate charge build-up, electrically and/or thermally insulate one or more components, roughen the surfaces of and/or minimize contact area between two or more components, prevent diffusion of materials between layers, reduce corrosion, erosion, and/or wear, passivate one or more components, modulate physical properties of one or more components (e.g., modulate the restoring force of a deformable layer), facilitate one or more manufacturing steps, and/or perform any other desired function.

Materials useful in forming protective coatings are known in the art, and include, for example, various polymers (e.g., hydrophobic polymers), microparticles (e.g., silicon-based nanoparticles), polystyrene, polymethylmethacrylate (PMMA), $SiO_2$, $ZrO_2$, $PbO_2$, $Al_2O_3$, $CrO_3$, $Si_3N_4$, $Al_2O_3$, $SiO_2$, tantalum pentoxide, diamond and diamond-like materials (e.g., diamond-like carbon (DLC) (e.g., "Diamonex DLC"), amorphous carbon ($\alpha$-C), cubic boron nitride (CBN)), metals (e.g., tungsten, gold, platinum, chromium, aluminum, hafnium, zirconium, copper, germanium, nickel, silver, tin, titanium, zinc), silicon, metal oxides, silicon oxides, ceramics, plastics, organic polymers, and mixtures and/or alloys thereof. Exemplary materials for dissipating charge include, for example, $Si_3N_4$, $Al_2O_3$, and $SiO_2$. Metal films, e.g., films comprising Cr, W, or Au, are also useful for dissipating charge. For example, a metal film protective coating on one or more surfaces of an interferometric modulator can provide conduction pathways for dissipating charge trapped in the optical stack, while not otherwise substantially interfering with the operation of the device. Exemplary materials for reducing or preventing stiction include, for example, various polymers (e.g., hydrophobic polymers), diamond and diamond-like materials, silicon-based particles (e.g., nanoparticles), polystyrene, and PMMA. In some preferred embodiments, the surface energy of an anti-stiction or other protective coating is lower than the surface energy of one or more surfaces of the microelectromechanical device. Additional materials for performing these and various other functions are known in the art, for example in the field of semiconductor manufacturing, as are methods for selectively etching a wide range of materials.

Those skilled in the art will understand that changes in the apparatus and manufacturing process described above are possible, for example, adding and/or removing components and/or steps, and/or changing their orders. Moreover, the methods, structures, and systems described herein are useful for fabricating other electronic devices, including other types of MEMS devices, for example, other types of optical modulators.

Moreover, while the above detailed description has shown, described, and pointed out novel features of the invention as applied to various embodiments, it will be understood that various omissions, substitutions, and changes in the form and details of the device or process illustrated may be made by those skilled in the art without departing from the spirit of the invention. As will be recognized, the present invention may be embodied within a form that does not provide all of the features and benefits set forth herein, as some features may be used or practiced separately from others.

What is claimed is:

1. A method of manufacturing an electromechanical device, the method comprising:

forming a composite layer on a surface of an electromechanical device, the composite layer comprising a mixture of a sacrificial material and a second material; and selectively removing the sacrificial material, relative to the second material, from the composite layer, thereby forming a coating on one or more surfaces of the electromechanical device, the coating comprising the second material.

2. The method of claim 1, wherein the sacrificial material is selectively removed by etching, the second material being substantially more resistant to the etching than the sacrificial material.

3. The method of claim 1, wherein forming the composite layer comprises separately depositing the sacrificial material and the second material.

4. The method of claim 1, wherein forming the composite layer comprises depositing the second material and the sacrificial material by chemical vapor deposition (CVD).

5. The method of claim 1, wherein forming the composite layer comprises depositing the sacrificial material and the second material by sputtering each material from a separate target.

6. The method of claim 1, wherein the coating electrically insulates one or more surfaces of the electromechanical device.

7. The method of claim 1, wherein the coating thermally insulates one or more surfaces of the electromechanical device.

8. The method of claim 1, wherein the coating electrically and thermally insulates one or more surfaces of the electromechanical device.

9. The method of claim 1, wherein the coating is configured to reduce stiction between two or more components of the electromechanical device.

10. The method of claim 9, wherein a surface energy of the coating is lower than a surface energy of one or more of the surfaces of the electromechanical device.

11. The method of claim 9, wherein the one or more surfaces of the electromechanical device comprises a surface of a deformable layer, and the coating increases the restoring force of the deformable layer.

12. The method of claim 9, wherein the coating is substantially hydrophobic.

13. The method of claim 9, wherein the second material is selected from diamond-like carbon, silicon-based particles, polystyrene, and PMMA.

14. The method of claim 13, wherein the second material has a dielectric constant of less than about 3.0.

15. The method of claim 1, wherein the second material is selected from the group consisting of: $Si_3N_4$, $Al_2O_3$, $SiO_2$, Cr, W, and Au.

16. The method of claim 1, wherein the coating protects the one or more surfaces of the electromechanical device against corrosion, erosion, or wear.

17. The method of claim 1, wherein the electromechanical device is an interferometric modulator comprising:

a substrate;

a mirror positioned over the substrate, the mirror being at least partially reflective to incident light; and an optical layer positioned over the substrate and spaced from the mirror, the optical layer being at least partially transmissive to incident light;

wherein the mixture comprises a layer between the mirror and the optical layer.

18. The method of claim 17, wherein the one or more surfaces of the interferometric modulator includes a surface of the optical layer.

19. The method of claim 17, wherein the one or more surfaces of the interferometric modulator includes a surface of the mirror.

20. An electromechanical device manufactured by the method of claim 1.

21. An interferometric modulator manufactured by the method of claim 17.

22. A method of manufacturing an electromechanical device, the method comprising:
- forming a composite layer on a surface of an electromechanical device, the composite layer comprising a mixture of a sacrificial material and a second material; and
- selectively removing the sacrificial material, relative to the second material, from the composite layer, thereby forming a coating on one or more surfaces of the electromechanical device, the coating comprising the second material,
- wherein forming the composite layer comprises sputtering a composite target, the composite target comprising the sacrificial material and the second material.

23. A method of manufacturing an electromechanical device, the method comprising:
- forming a composite layer on a surface of an electromechanical device, the composite layer comprising a mixture of a sacrificial material and a second material; and
- selectively removing the sacrificial material, relative to the second material, from the composite layer, thereby forming a coating on one or more surfaces of the electromechanical device, the coating comprising the second material,
- wherein the coating is configured to dissipate an electrical charge between two or more components of the electromechanical device.

* * * * *

UNITED STATES PATENT AND TRADEMARK OFFICE
CERTIFICATE OF CORRECTION

PATENT NO. : 8,300,299 B2
APPLICATION NO. : 13/098292
DATED : October 30, 2012
INVENTOR(S) : Tung et al.

It is certified that error appears in the above-identified patent and that said Letters Patent is hereby corrected as shown below:

In the Specification:

In column 1 at line 25, Change "and or" to --and/or--.

In column 3 at line 22, After "FIG. 5A" insert --.--.

In column 6 at line 56, After "respectively" insert --.--.

In column 8 at line 16, Change "ore" to --or--.

In column 8 at line 16, Change "device s" to --devices--.

In column 18 at line 21, After "polyimides" insert --.--.

In column 19 at line 1, Change "ME" to --RIE--.

In column 20 at line 64, Change "Walls" to --Waals--.

Signed and Sealed this
Thirtieth Day of April, 2013

Teresa Stanek Rea
*Acting Director of the United States Patent and Trademark Office*